United States Patent
Li et al.

(10) Patent No.: US 11,983,606 B2
(45) Date of Patent: May 14, 2024

(54) METHOD AND DEVICE FOR CONSTRUCTING QUANTUM CIRCUIT OF QRAM ARCHITECTURE, AND METHOD AND DEVICE FOR PARSING QUANTUM ADDRESS DATA

(71) Applicant: Origin Quantum Computing Technology Co., Ltd., Anhui (CN)

(72) Inventors: Ye Li, Hefei (CN); Ningbo An, Hefei (CN); Menghan Dou, Hefei (CN)

(73) Assignee: Origin Quantum Computing Technology (Hefei) Co., Ltd., Anhui (CN)

( * ) Notice: Subject to any disclaimer, the term of this patent is extended or adjusted under 35 U.S.C. 154(b) by 0 days.

(21) Appl. No.: 18/039,453

(22) PCT Filed: May 26, 2021

(86) PCT No.: PCT/CN2021/096102
§ 371 (c)(1),
(2) Date: May 30, 2023

(87) PCT Pub. No.: WO2022/110705
PCT Pub. Date: Jun. 2, 2022

(65) Prior Publication Data
US 2024/0037433 A1    Feb. 1, 2024

(30) Foreign Application Priority Data

Nov. 30, 2020 (CN) .......................... 202011376073.2
Nov. 30, 2020 (CN) .......................... 202011376086.X

(51) Int. Cl.
*G11C 8/00*   (2006.01)
*G06N 10/20*   (2022.01)
*G06N 10/40*   (2022.01)

(52) U.S. Cl.
CPC ............. *G06N 10/20* (2022.01); *G06N 10/40* (2022.01); *G11C 8/00* (2013.01)

(58) Field of Classification Search
CPC ........... G06N 10/20; G06N 10/40; G11C 8/00
See application file for complete search history.

(56) References Cited

U.S. PATENT DOCUMENTS 5,924,115 A * 7/1999 Von Herzen ............ G06F 12/06
                                                                 711/159
2009/0010090 A1   1/2009 Lloyd et al.
(Continued)

*Primary Examiner* — Ajay Ojha
(74) *Attorney, Agent, or Firm* — Baker Botts LLP

(57) ABSTRACT

Disclosed are a method and device for constructing a quantum circuit of a QRAM architecture, the QRAM architecture being configured for accessing data and being a binary tree structure, the method including: partitioning the binary tree structure into basic circuit structures, wherein a basic circuit structure comprises address bits and data bits of one subtree node and data bits of two child nodes in the lower layer of the one subtree node; determining qubits required for a basic quantum circuit to be constructed, according to qubits included in the basic circuit structure; determining an input and an output of the basic quantum circuit to be constructed, according to action relationships between the qubits required for the basic quantum circuit to be constructed; and constructing a basic quantum circuit corresponding to the basic circuit structure, according to the input and the output using the required qubits and quantum logic gates.

16 Claims, 9 Drawing Sheets

(56) References Cited

U.S. PATENT DOCUMENTS

2022/0067564 A1\* 3/2022 El Euch ................. G06N 10/00
2022/0147266 A1\* 5/2022 Hann .................... G06N 10/20

\* cited by examiner

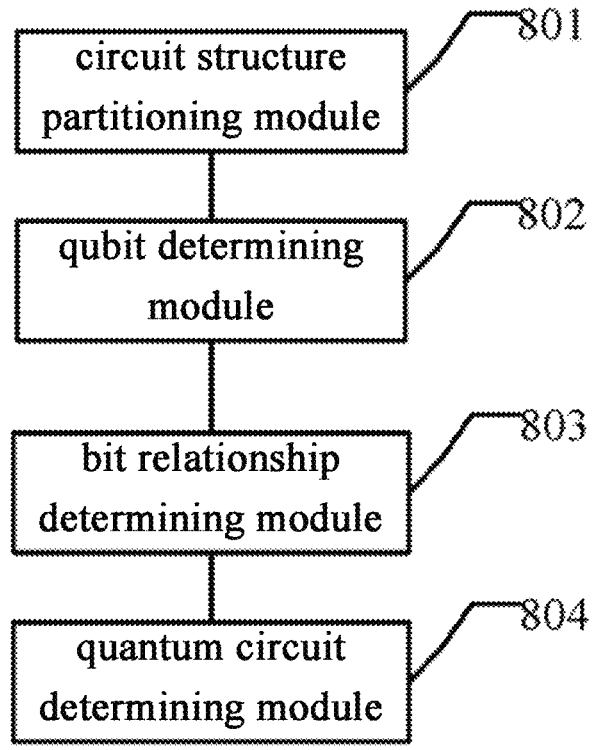

FIG.8

| when receiving a target quantum address, sequentially acquiring each quantum address data in the target quantum address according to a preset data bit acquisition rule | — S901 |

↓

| sequentially moving through a preset quantum circuit each quantum address data respectively to address bits of subtree nodes of a corresponding layer in the QRAM architecture, so as to complete the parsing of the target quantum address | — S902 |

FIG.9

METHOD AND DEVICE FOR CONSTRUCTING QUANTUM CIRCUIT OF QRAM ARCHITECTURE, AND METHOD AND DEVICE FOR PARSING QUANTUM ADDRESS DATA

CROSS-REFERENCE TO RELATED APPLICATIONS

The present application claims priority to Chinese Patent Application No. 202011376086.X, entitled "METHOD AND DEVICE FOR CONSTRUCTING QUANTUM CIRCUIT OF QRAM ARCHITECTURE", filed on Nov. 30, 2020; and Chinese Patent Application No. 202011376073.2, entitled "METHOD, DEVICE, STORAGE MEDIUM AND ELECTRONIC DEVICE FOR PARSING QUANTUM ADDRESS DATA", filed on Nov. 30, 2020, all of which are hereby incorporated by reference in their entireties.

TECHNICAL FIELD

The present application relates to the technical field of quantum computing, in particular to a method and device for constructing a quantum circuit of a QRAM architecture, and a method, device, storage medium and electronic device for parsing quantum address data.

BACKGROUND

A quantum computer is a physical device that follows the Laws of Quantum Mechanics to perform high-speed mathematical and logical operations, and to store and process quantum information. A quantum computer is defined as any device that processes and computes quantum information and runs a quantum algorithm. Quantum computers have become a key technology being researched, because of their ability to solve mathematic problems more efficiently than ordinary computers, for example, it can speed up the time to crack RSA keys from hundreds of years to only a few hours.

One of the most fundamental problems in practical implementations of quantum information processing is to develop a valid procedure for retrieving classical/quantum data from databases and converting the retrieved data into quantum superposition states. A Quantum Random Access Memory (QRAM), which stores information and enables superposition state queries, could play a key role in dramatically accelerating quantum algorithms for data analysis (including big data machine learning applications). A QRAM is a memory system for quantum computers, and is a quantum version of a classical computer RAM. A QRAM can be used for creating a quantum superposition state containing information. In contrast to a RAM which needs to read data one by one, a QRAM can read superimposed data in the form of superposition address. At present, however, a QRAM is still insufficient in valid physical structures, and not easy to implement and expand, bringing certain difficulties to the analysis and research of complex quantum algorithms.

SUMMARY

The present application aims to providing a method for constructing a quantum circuit of a QRAM architecture and a method for parsing quantum address data, so as to address deficiencies in the prior art. The present application is capable of proposing a valid implementation of a quantum circuit of a QRAM architecture and parsing of quantum address data, which implementation is applied to the QRAM architecture and realizes for the QRAM architecture writing and storing an address and reading data both in quantum state form, thereby speeding up analysis and verification of a complex quantum algorithm.

An embodiment of the present application provides a method for constructing a quantum circuit of a QRAM architecture, the QRAM architecture being configured for accessing data and being a binary tree structure, the QRAM architecture including N layers of subtree node and one layer of leaf node, the subtree node including address bits and first data bits, the leaf node including second data bits for storing data, the N being an address length for writing into the QRAM architecture, the method including:

partitioning the binary tree structure into basic circuit structures, wherein a basic circuit structure includes address bits and data bits of one subtree node and data bits of two child nodes in the lower layer of the one subtree node;

determining qubits required for a basic quantum circuit to be constructed, according to qubits included in the basic circuit structure;

determining an input and an output of the basic quantum circuit to be constructed, according to action relationships between the qubits required for the basic quantum circuit to be constructed; and constructing a basic quantum circuit corresponding to the basic circuit structure, according to the input and the output using the required qubits and quantum logic gates.

In one embodiment of the present application, said "determining qubits required for a basic quantum circuit to be constructed, according to qubits included in the basic circuit structure" includes:

determining one by one the qubits included in the basic circuit structure as qubits required for the basic quantum circuit to be constructed.

In one embodiment of the present application, said "determining an input and an output of the basic quantum circuit to be constructed, according to action relationships between the qubits required for the basic quantum circuit to be constructed" includes:

acquiring action relationships between the qubits required for the basic quantum circuit to be constructed, according to implemented functionalities of the basic circuit structure; and determining an input and an output of the basic quantum circuit to be constructed, according to action relationships between the qubits required for the basic quantum circuit to be constructed.

In one embodiment of the application, said "determining an input and an output of the basic quantum circuit to be constructed, according to action relationships between the qubits required for the basic quantum circuit to be constructed" includes:

when the action relationship between qubits included in the basic circuit structure is a first action relationship, an input and an output of a first basic quantum circuit to be constructed are determined as follows: an output and an input of address bits of one subtree node remain unchanged, an input of data bits of the subtree node is one address bit and an output of the data bits of the subtree node is |0>, inputs of data bits of two child nodes of the lower layer are both |0>, outputs of data bits of the two child nodes of the lower layer are both the address bit; and when the action relationship between qubits included in the basic circuit structure is a second action relationship, an input and an output of a second basic quantum circuit to be constructed are determined as follows: an input of address bits of one subtree node is one address bit, an output of the address bits of the one subtree node remains unchanged, inputs of data bits of two child nodes of the lower layer are respectively a first data and a second data, outputs of the data bits of the two child nodes of the lower layer remain unchanged, an input of data bits of the subtree node is |0>, and an output of the data bits of the subtree node is determined by the address bit and is the first data or the second data.

In one embodiment of the present application, said "constructing a basic quantum circuit corresponding to the basic circuit structure, according to the input and the output using the required qubits and quantum logic gates" includes:
  when the input and the output are determined to be the input and the output of the first basic quantum circuit to be constructed, a CNOT gate acting on the qubits included in the basic circuit structure is constructed, so as to acquire a first basic quantum circuit corresponding to the basic circuit structure; and
  when the input and the output are determined to be the input and the output of the second basic quantum circuit to be constructed, a Toffoli gate acting on the qubits included in the basic circuit structure is constructed, or a NOT gate, a CNOT gate and a Toffoli gate acting on the qubits included in the basic circuit structure are constructed, so as to acquire a second basic quantum circuit corresponding to the basic circuit structure.

In an embodiment of the present application, the method further includes:
  receiving the address represented by a quantum state;
  parsing the address, and moving each bit of the address respectively to address bits of subtree node of a corresponding layer; wherein each one bit of the address corresponds to one respective layer of the N layers of subtree node; and
  starting from the leaf node, moving, according to an address stored in address bits of each layer of subtree node, data stored in the leaf node to data bits of the upper layer of subtree node, until data corresponding to the address is output at a subtree node at the root of the binary tree structure.

In one embodiment of the present application, said "moving each bit of the address respectively to address bits of subtree node of a corresponding layer" includes:
  for each bit of the address, starting from k=N, moving the k-th bit of the address to the first layer of subtree node at the root of the binary tree structure;
  starting from the first layer of subtree node, executing repeatedly moving of the k-th bit of the address in the current layer of subtree node to the lower layer of subtree node, until it is moved to the address bits of the subtree node of the k-th layer, wherein the k is a positive integer taking values sequentially from N to 1.

An embodiment of the present application provides a device for constructing a quantum circuit of a QRAM architecture, the QRAM architecture being configured for accessing data and being a binary tree structure, the QRAM architecture including N layers of subtree node and one layer of leaf node, the subtree node including address bits and first data bits, the leaf node including second data bits for storing data, the N being an address length for writing into the QRAM architecture, the device including:
  a circuit structure partitioning module, configured for partitioning the binary tree structure into basic circuit structures, wherein a basic circuit structure includes address bits and data bits of one subtree node and data bits of two child nodes in the lower layer of the one subtree node;
  a qubit determining module, configured for determining qubits required for a basic quantum circuit to be constructed, according to qubits included in the basic circuit structure;
  a bit relationship determining module, configured for determining an input and an output of the basic quantum circuit to be constructed, according to action relationships between the qubits required for the basic quantum circuit to be constructed; and
  a quantum circuit determining module, configured for constructing a basic quantum circuit corresponding to the basic circuit structure, according to the input and the output using the required qubits and quantum logic gates.

An embodiment of the present application provides a method for parsing quantum address data, applied to a pre-built quantum random storage access (QRAM) architecture for accessing data, the QRAM architecture including at least one layer of subtree nodes, each layer of subtree nodes includes corresponding address bits, the method for parsing quantum address data including:
  when receiving a target quantum address, sequentially acquiring each quantum address data in the target quantum address according to a preset data bit acquisition rule;
  sequentially moving through a preset quantum circuit each quantum address data respectively to address bits of subtree nodes of a corresponding layer in the QRAM architecture, so as to complete the parsing of the target quantum address.

In one embodiment of the application, the method further includes, before said "sequentially moving through a preset quantum circuit each quantum address data respectively to address bits of subtree nodes of a corresponding layer in the QRAM architecture":
  acquiring numbers of address bits of each quantum address data in the target quantum address, and determining corresponding layer of subtree nodes for each quantum address data in the QRAM architecture according to preset corresponding rules and the numbers of address bits.

In one embodiment of the present application, wherein a total number of bits of the target quantum address equals to a total number of layers of subtree nodes in the QRAM architecture, both the total number of bits and the total number of layers are N, N being a positive integer, said "sequentially moving through a preset quantum circuit each quantum address data respectively to address bits of subtree nodes of a corresponding layer in the QRAM architecture" specifically includes:
  acquiring a 0th bit of address data in the target quantum address, determining the (N−1)-th layer of subtree nodes in the QRAM architecture, and moving the $0^{th}$ bit of address data to address bits of the (N−1)-th layer of subtree nodes through the preset quantum circuit;
  acquiring the next bit of address data in the target quantum address, and determining the lower layer of subtree nodes in the QRAM architecture, so as to move the next bit of address data, until N address data in the target quantum address are respectively moved to address bits of corresponding N layers of subtree nodes in the QRAM architecture.

In one embodiment of the present application, wherein said "moving the $0^{th}$ bit of address data to address bits of the (N−1)-th layer of subtree nodes through the preset quantum circuit" includes:

moving the $0^{th}$ bit of the address data to data bits of the subtree nodes of the 0th layer of the QRAM architecture;

moving, through the preset quantum circuit, the $0^{th}$ bit of the address data in the data bits of the subtree nodes of the 0th layer to the data bits of the subtree nodes of the lower layer, until the $0^{th}$ bit of address data is moved to the data bits of subtree nodes of the (N−1)-th layer; and swapping the $0^{th}$ bit of the address data stored in the data bits of subtree nodes of the (N−1)-th layer to address bits of the subtree nodes of the (N−1)-th layer.

In one embodiment of the present application, said "acquiring the next bit of address data in the target quantum address, and determining the lower layer of subtree nodes in the QRAM architecture, so as to move the next bit of address data" specifically includes:

after the $0^{th}$ bit of the address data in the data bits of the subtree nodes of the $0^{th}$ layer is moved to the data bits of the subtree nodes of the lower layer, moving through the preset quantum circuit the $1^{st}$ bit of the address data to the data bits of the subtree nodes of the $0^{th}$ layer of the QRAM architecture, so as to execute moving of the address data in the target quantum address in a staggered way;

moving, through the preset quantum circuit, the $1^{st}$ bit of the address data in the data bits of the subtree nodes of the $0^{th}$ layer to data bits of subtree nodes of the lower layer, until the $1^{st}$ bit of the address data is moved to data bits of subtree nodes of the (N−2)-th layer.

In one embodiment of the present application, the QRAM architecture further includes a leaf node connected to subtree nodes of the (N−1)-th layer, the leaf node further includes data bits of the leaf node for storing data, the method further includes, after said "sequentially moving through a preset quantum circuit each quantum address data respectively to address bits of subtree nodes of a corresponding layer in the QRAM architecture, so as to complete the parsing of the target quantum address":

starting from the leaf node, moving, according to said each quantum address data stored in address bits of each layer of subtree node, target data stored in data bits of the leaf node to data bits of the upper layer of subtree node, until target data corresponding to the target quantum address is output at a subtree node at the root of the binary tree structure.

In one embodiment of the application, the method further includes, after said "target data corresponding to the target quantum address is output at a subtree node at the root of the binary tree structure":

executing uncomputing on the QRAM structure to restore the QRAM structure to its initial state.

Another embodiment of the present application provides a device for parsing quantum address data, applied to a pre-built quantum random storage access (QRAM) architecture for accessing data, the QRAM architecture including at least one layer of subtree nodes, each layer of subtree nodes includes corresponding address bits, the device including:

an address acquiring module, configured for: when receiving a target quantum address, sequentially acquiring each quantum address data in the target quantum address according to a preset data bit acquisition rule; and an address parsing module, configured for: sequentially moving through a preset quantum circuit each quantum address data respectively to address bits of subtree nodes of a corresponding layer in the QRAM architecture, so as to complete the parsing of the target quantum address.

Another embodiment of the present application provides a storage medium having a computer program stored therein, wherein the computer program is configured to perform, during execution thereof, the method of any one of the above embodiments.

Another embodiment of the present application provides an electronic device, including: a memory having a computer program stored therein, and a processor, configured to execute the computer program to perform the method of any one of the above embodiments.

BRIEF DESCRIPTION OF THE DRAWINGS

FIG. 8 is a schematic structural illustration of a device for constructing a quantum circuit of a QRAM architecture.

FIG. 9 is a schematic flowchart of a method for parsing quantum address data.

The present application will be further described in conjunction with the embodiments and accompanying drawings.

DETAILED DESCRIPTION

The exemplary embodiments described below with reference to the accompanying drawings are intended only to explain the present application, and are not to be construed as restriction thereto.

First of all, an embodiment of the present application provides a method for constructing a quantum circuit of a QRAM architecture, which can be applied to electronic equipment, such as a computer terminal, specifically an ordinary computer, a quantum computer, and the like.

Figure 1:
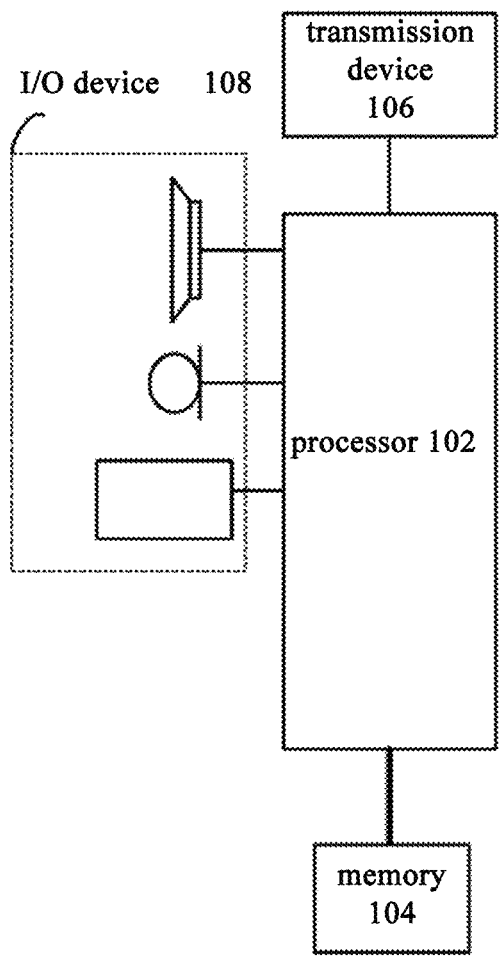
FIG. 1 is a block diagram of a hardware structure of a computer terminal for a method for constructing a quantum circuit of a QRAM architecture and a method for parsing quantum address data provided in an embodiment of the present application.

The following will describe the embodiments in detail, using operation thereof on a computer terminal as an example. FIG. 1 is a block diagram of a hardware structure of a computer terminal for a method for constructing a quantum circuit of a QRAM architecture provided in an embodiment of the present application. As shown in FIG. 1, a computer terminal may include one or more (only one is shown in FIG. 1) processor 102 (a processor 102 may include but not limited to processing devices such as microprocessors MCUs or programmable logic devices FPGAs) and a memory 104 for storing quantum data. In one of the embodiments, the above-mentioned computer terminal may further include a transmission device 106 for communication functions, and an I/O (input/output) device 108. Those skilled in the art can understand that the structure shown in FIG. 1 is only for illustration, and constitutes no limitation to the structure of the above computer terminal. For example, the computer terminal may also include more or fewer components than shown in FIG. 1, or have a configuration different from that shown in FIG. 1.

The memory 104 can be used for storing software programs and modules of application software, such as program instructions/modules corresponding to the method for constructing a quantum circuit of a QRAM architecture in an embodiment of the present disclosure. By running software programs and modules stored in the memory 104, the processor 102 executes various functional applications and data processing, i.e., to implement the above-mentioned method. The memory 104 may include a high-speed random-access memory, and may also include non-volatile memories, such as one or more of magnetic storage devices, flash memory, or other non-volatile solid-state memories. In some examples, the memory 104 may further include a memory that is remotely located relative to the processor 102, and these remote memories may be connected to a computer terminal through a network. Examples of the aforementioned networks include, but are not limited to, the Internet, intranets, local area networks, mobile communication networks, and combinations thereof.

The transmission device 106 is used for receiving or transmit data via a network. A specific example of the above-mentioned network may include a wireless network provided by a communication provider of the computer terminal. In one example, the transmission device 106 includes a network adapter (Network Interface Controller, NIC), which can be connected to other network devices through a base station so as to communicate with the Internet. In one example, the transmission device 106 may be a radio frequency (Radio Frequency, RF) module, which is used for communicating with the Internet in a wireless manner.

It is to be noted that a real quantum computer is of a hybrid structure, which consists of two parts: one is a classical computer, which functions to execute classical computing and control; the other is a quantum device, which functions to run quantum programs and implementing quantum computing. A quantum program is a series of instruction sequences written in a quantum language such as Qrunes that can be run on a quantum computer, which supports quantum logic gate operations and ultimately realizes quantum computing. Specifically, a quantum program is a series of instruction sequences that operate quantum logic gates in a certain sequence.

In practical applications, due to the limitation of the development of quantum device hardware, quantum computing simulations are usually required to verify quantum algorithms, quantum applications, etc. Quantum computing simulation is the process of simulating the operation of quantum programs corresponding to specific problems using a virtual architecture (that is, a quantum virtual machine) built with the resources of ordinary computers. Typically, quantum programs corresponding to specific problems need to be constructed. The quantum program referred to in the embodiment of the present disclosure is a program written in a classical language to characterize qubits and their evolution, in which qubits, quantum logic gates, etc. related to quantum computing all have expressions with corresponding classical codes.

As an embodiment of quantum programs, quantum circuits, also known as quantum logic circuits, are the most commonly used general-purpose quantum computing models, which means circuits that operate on qubits under abstract concepts: components thereof include qubits, circuits (timelines), and various quantum logic gates; and results thereof usually need to be read out through quantum measurement operations.

Unlike traditional circuits, which are connected by metal wires to transmit voltage signals or current signals, in quantum circuits, the circuits can be regarded as connected by time, that is, the state of qubits evolves naturally with time. In this process, it follows the instruction of the Hamiltonian operator, and is operated upon its encounter with a logic gate.

A quantum program corresponds to a total quantum circuit as a whole, and the quantum program described in the application refers to this total quantum circuit, wherein, the total number of qubits in the total quantum circuit and the total number of qubits of the quantum program same. It can be understood as: a quantum program can be composed of quantum circuits, measurement operations for qubits in quantum circuits, registers for saving measurement results, and control flow node (jump instructions). A quantum circuit can contain tens, hundreds or even thousands of Tens of thousands of quantum logic gate operations. The execution process of a quantum program is the process of executing all quantum logic gates according to a certain time sequence. It should be noted that timing refers to the time sequence in which a single quantum logic gate is executed.

It is to be noted that in classical computing, the most basic unit is a bit, and the most basic control mode is a logic gate. With a combination of logic gates, the purpose of controlling a circuit can be achieved. Similarly, the means by which to handle qubits is quantum logic gates. The use of quantum logic gates can make the quantum state evolve. Accordingly, quantum logic gates are the basis of quantum circuits. Quantum logic gates include single-bit quantum logic gates, such as Hadamard gates (H gates), Pauli-X gates (X-gates), Pauli-Y gates (Y-gates), Pauli-Z gates (Z-gates), RX gates, RY gates, RZ gates; multi-bit quantum logic gates such as CNOT gates, CR gates, iSWAP gates, Toffoli gates. Quantum logic gates are generally represented by unitary matrices, which are not only in the form of matrices but also a certain kind of operation and transformation. Generally, a quantum logic gate functions on a quantum state is to compute by a unitary matrix left-multiplied by a matrix corresponding to the right vector of the quantum state.

QRAMs have been playing the role of classical data to quantum data conversion (as an intermediate memory for classical data to be converted into quantum data) in various quantum algorithms. An important prerequisite for these algorithms to enable quantum acceleration is exactly that there cannot be too long time for QRAM to execute a "query". Specifically, if the problem size is N, then a generally acceptable query time should be $O(1)$ or $O(\text{polylog } N)$, rather than $O(N)$.

QRAMs have many possible physical implementations, such as "the earliest proposed" optical systems, and later proposed acoustic systems. All of these systems are likely to realize a QRAM with $O(\text{polylog } N)$ access time, which can be considered as a valid solution. Regarding a QRAM, this application proposes a QRAM physical architecture based on the Nearest-neighbor premise.

No specific physical system has been required for implementation of such a QRAM architecture. It can be implemented in physical systems that have been proven to be .possible for quantum computing, such as optics, semiconductor quantum dots, superconducting circuits, ion traps, etc.

Figure 2:
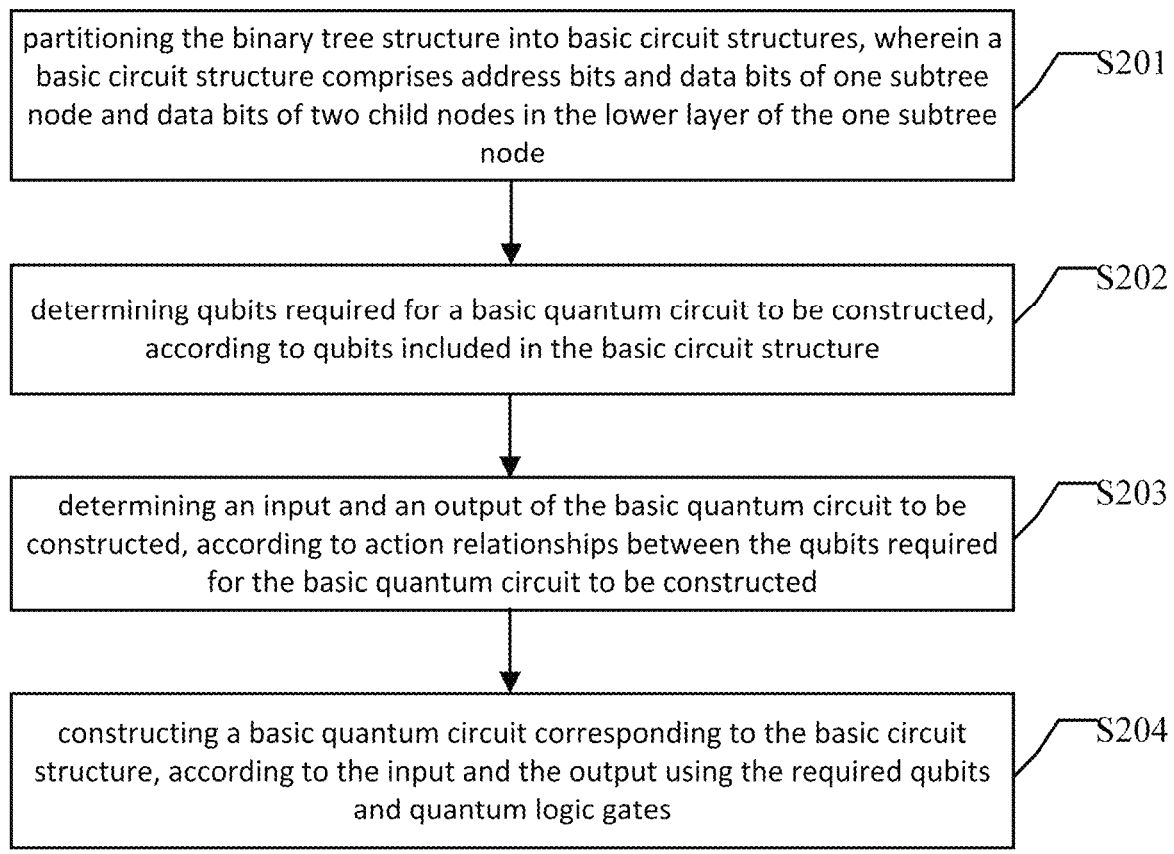
FIG. 2 is a schematic flowchart of a method for constructing a quantum circuit of a QRAM architecture provided in an embodiment of the present application.
Figure 3:
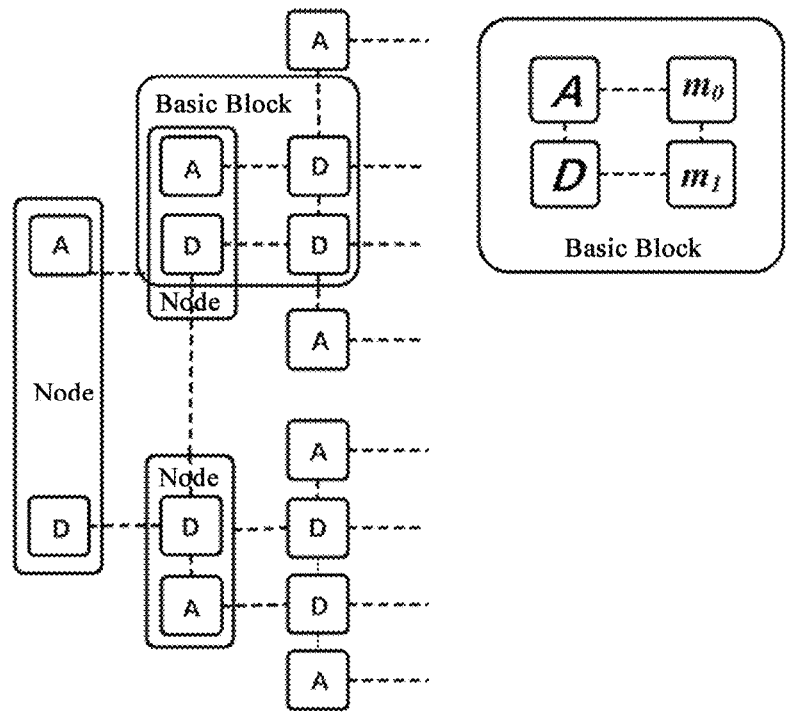
FIG. 3 is a schematic architectural illustration of a QRAM provided in an embodiment of the present application.

Referring to FIG. 2, FIG. 2 is a schematic flowchart of a method for constructing a quantum circuit of a QRAM architecture, the QRAM architecture being configured for accessing data and being a binary tree structure, the QRAM architecture including N layers of subtree node and one layer of leaf node, the subtree node including address bits and first data bits, the leaf node including second data bits for storing data, the N being an address length for writing into the QRAM architecture;

Specifically, the entire QRAM may exhibit a binary tree structure. As shown in FIG. 3, each small block in the figure represents a Qubit (quantum bit), and there are two types of Qubits: A-bit, i.e., address bit (Address Qubit); D-bit, i.e., data bit (Data Qubit). An A-bit and a D-bit vertically adjacent thereto constitute a group called a "node", which is a basic unit in a binary tree. A binary tree consists of all the nodes thereof. The root of the binary tree is the output part of the QRAM. Each leaf node (the last layer, not shown in the figure) records one binary data bit.

For a QRAM with an address length of N (such as typical data word lengths, 32 bits, 64 bits, etc.), the maximum addressing space of the QRAM is from 0 to $2^N-1$. Such a QRAM has a total of N layers of subtree node plus the last one layer of leaf node, wherein the leaf nodes at the last one layer can store up to $2^N$ binary bits. Of course, the definition thereof may be expanded according to the "byte" (1 byte=8 bits) of classical computers in the prior art, where $2^{(3+N)}$ binary bits need to be stored for an N-bit QRAM, corresponding to a binary tree with the height of 3+N.

The method specifically includes:

Step S201, partitioning the binary tree structure into basic circuit structures, wherein a basic circuit structure includes address bits and data bits of one subtree node and data bits of two child nodes in the lower layer of the one subtree node;

Exemplarily, as shown in FIG. 3, a Basic Block is a basic circuit structure spanning two layers, consisting of one node and D-bits (respectively referred to as m0 and m1) in its two child nodes, with a total of 4 bits. Different basic blocks may overlap and share certain bits. According to design requirements of such basic circuit structures, the binary tree structure of the QRAM may be partitioned to find all the basic circuit structures in it.

Step S202, determining qubits required for a basic quantum circuit to be constructed, according to qubits included in the basic circuit structure;

Specifically, the qubits included in the basic circuit structure may be one-by-one determined as qubits required for the basic quantum circuit to be constructed. For example, the basic circuit structure "Basic Block" shown in FIG. 3 includes 4 bits, which corresponds to the 4 qubits required by the basic quantum circuit.

Step S203, determining an input and an output of the basic quantum circuit to be constructed, according to action relationships between the qubits required for the basic quantum circuit to be constructed;

Specifically, action relationships between the qubits required for the basic quantum circuit to be constructed may be acquired according to implemented functionalities of the basic circuit structure; and an input and an output of the basic quantum circuit to be constructed may be determined according to action relationships between the qubits required for the basic quantum circuit to be constructed.

According to desired sub-functions designed by the basic circuit structure, it is determined that action relationships need to exist between the required qubits. Such action relationships correspondingly determine the output of the basic quantum circuit. In terms of specific implementation, the corresponding actions may be realized by various quantum logic gates applied to the qubit.

In practical applications, when the action relationship between qubits included in the basic circuit structure is a first action relationship, an input and an output of a first basic quantum circuit to be constructed are determined as follows: an output and an input of address bits of one subtree node remain unchanged, an input of data bits of the subtree node is one address bit and an output of the data bits of the subtree node is $|0\rangle$, inputs of data bits of two child nodes of the lower layer are both $|0\rangle$, outputs of data bits of the two child nodes of the lower layer are both the address bit; and when the action relationship between qubits included in the basic circuit structure is a second action relationship, an input and an output of a second basic quantum circuit to be constructed are determined as follows: an input of address bits of one subtree node is one address bit, an output of the address bits of the one subtree node remains unchanged, inputs of data bits of two child nodes of the lower layer are respectively a first data and a second data, outputs of the data bits of the two child nodes of the lower layer remain unchanged, an input of data bits of the subtree node is $|0\rangle$, and an output of the data bits of the subtree node is determined by the address bit and is the first data or the second data.

Step S204, constructing a basic quantum circuit corresponding to the basic circuit structure, according to the input and the output using the required qubits and quantum logic gates.

Specifically, when the input and the output are determined to be the input and the output of the first basic quantum circuit to be constructed, a CNOT gate acting on the qubits included in the basic circuit structure is constructed, so as to acquire a first basic quantum circuit corresponding to the basic circuit structure; and when the input and the output are determined to be the input and the output of the second basic quantum circuit to be constructed, a Toffoli gate acting on the qubits included in the basic circuit structure is constructed, or a NOT gate, a CNOT gate and a Toffoli gate acting on the qubits included in the basic circuit structure are constructed, so as to acquire a second basic quantum circuit corresponding to the basic circuit structure.

As compared to the prior art, this application provides a method for constructing a quantum circuit of a QRAM architecture, the QRAM architecture being configured for accessing data and being a binary tree structure, the QRAM architecture including N layers of subtree node and one layer of leaf node, the subtree node including address bits and first data bits, the leaf node including second data bits for storing data, the N being an address length for writing into the QRAM architecture, the method including: partitioning the binary tree structure into basic circuit structures, wherein a basic circuit structure includes address bits and data bits of one subtree node and data bits of two child nodes in the lower layer of the one subtree node; determining qubits required for a basic quantum circuit to be constructed, according to qubits included in the basic circuit structure; determining an input and an output of the basic quantum circuit to be constructed, according to action relationships between the qubits required for the basic quantum circuit to be constructed; and constructing a basic quantum circuit corresponding to the basic circuit structure, according to the input and the output using the required qubits and quantum logic gates. It can be seen that, with a valid quantum circuit of a QRAM architecture proposed, the function of writing an address in the form of a quantum state and reading data can be realized, thereby speeding up analysis and verification of complex quantum algorithms.

In one specific implementation, one Basic Block may be preset to realize two implementations corresponding to two types of basic quantum circuits, which two types are called "first basic quantum circuit (sub-circuit a)" and "second basic quantum circuit (sub-circuit b)"

Figure 4A:
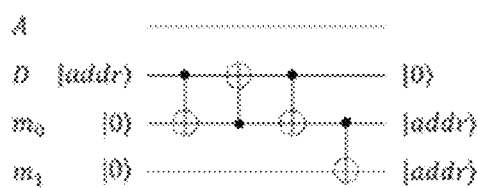
FIG. 4 is a schematic illustration of a basic quantum circuit for a QRAM architecture provided in an embodiment of the present application.

The "sub-circuit a" is as shown in FIG. 4(a). The function it realizes does not involve any A-bit: it moves the address data "addr" in the D-bits into m0 and m1. Therefore, there is no interaction between the A-bit and any other bit, while there is a first action relationship between the D-bit on one hand, and m0, m1 on the other hand. Before running this circuit, the quantum state inputs in m0 and m1 are both guaranteed to be 0 state. After running this circuit, the input and output of the A-bit remain unchanged, the output in the D-bit is guaranteed to be 0 state, and the outputs of both m0 and m1 are the data "addr" in the address bits. Here, this circuit uses 4 CNOT gates, which in FIG. 4(a) are indicated by a "⊕" icon on one bit plus a connection line connecting another bit.

Figure 4B:
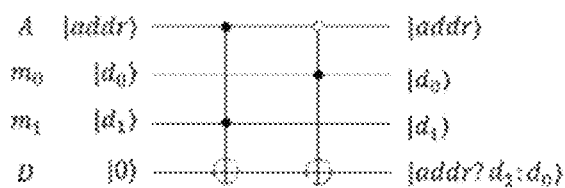

The "sub-circuit b" is as shown in FIG. 4(b). The function it realizes is to selectively move the data of m0 or m1 to the D-bit of the upper layer, according to the address data "addr" of the A-bit. Therefore, there is a second action relationship between the A-bit, the D-bit on one hand, and m0 bit, m1 bit on the other hand. In the case that A is 0, move the data of m0 (corresponding subscript is 0) to D-bits through the Toffoli gate, the input and the output of the A-bit remain unchanged. Otherwise, in the case that A is 1, move the data of m1 (corresponding subscript is 1) to the D-bit through a Toffoli gate, the input and the output of the A-bit remain unchanged, the input of the D-bit is 0, the output of the D-bit is the first data d1 of m1, while the input and the output of the m0 bit and the m1 bit remain unchanged. In the case that the positions of m0 and m1 are swapped, the functions thereof remain the same: that is, in the case that A is 0, the data of m0 is moved to the D-bits; in the case that A is 1, the data of m1 is moved to the D-bits. In FIG. 4(b), the Toffoli gate is represented by a "⊕" icon on one bit plus connection lines connecting another two bits, wherein a solid center of the icon indicates actual control, i.e., to execute the quantum logic gate when the quantum state of the bit is 1; and wherein a hollow center of the icon indicates virtual control, i.e., to execute the quantum logic gate when the quantum state of the bit is 0.

Figure 4C:
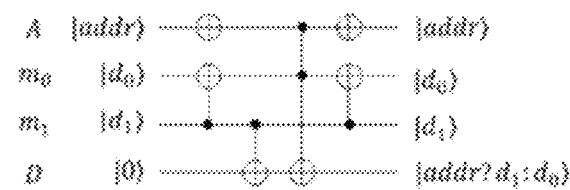

In addition, a "sub-circuit c" implements the same function as the "sub-circuit b". By contrast, as shown in FIG. 4(c), the sub-circuit c uses only one Toffoli gate, three CNOT gates and two NOT gates, which are relatively optimized (as the implementation of a Toffoli gate is very complicated), and can be used as equivalent alternatives. Here, a "⊕" icon on one bit indicates a NOT gate. It should be noted that this is not a specific limitation on construction of the basic quantum circuit required by the Basic Block: other quantum circuits that can realize the functions of "sub-circuit a" and "sub-circuit b" also fall within the scope of protection of this application.

Further, in practical applications, the method may also include:

S205, receiving the address represented by a quantum state;

In applications in the quantum field, a QRAM can be used to produce quantum superposition states containing information. Compared with a RAM, which needs to read in a "one-by-one" manner, a QRAM can read superimposed data with a superposition address. For example, to store e0, e1, ..., e(n−1) in the address [0, N): if the classical RAM is used, with the input of the address "i", the output of data "ei" is obtained; for the quantum version thereof "QRAM", the quantum state below may be input as the address:

$$\Sigma |i\rangle$$

The following output is obtained with QRAM:

$$\Sigma |i\rangle |e_i\rangle$$

Such a process of inputting an address and outputting data may be called a "query" or an "access".

Before reading data, initialization is required. This "initialization" is actually the writing process of a QRAM, during which data is imported one by one.

When a quantum address is handed down to the QRAM, the QRAM receives and then parses the address, and then writes address information into an A-bit in the entire architecture.

S206, parsing the address, and moving each bit of the address respectively to address bits of subtree node of a corresponding layer; wherein each one bit of the address corresponds to one respective layer of the N layers of subtree node;

Specifically, for each bit of the address, starting from k=N, you may move the k-th bit of the address to the first layer of subtree node at the root of the binary tree structure; wherein the k-th bit of the address may be moved to data bits of the first layer of subtree node.

Starting from the first layer of subtree node, executing repeatedly moving of the k-th bit of the address in the current layer of subtree node to the lower layer of subtree node, until it is moved to the address bits of the subtree node of the k-th layer, wherein the k is a positive integer taking values sequentially from N to 1. Accordingly, propagation of an address is realized.

Alternatively, starting from k=1, moving the k-th bit of the address to the first layer of subtree node at the root of the binary tree structure; starting from the first layer of subtree node, executing repeatedly moving of the k-th bit of the address in the current layer of subtree node to the lower layer of subtree node, until it is moved to the address bits of the subtree node of the (N−k+1)-th layer, wherein the k is a positive integer taking values sequentially from 1 to N.

In one of the embodiments, after the k-th bit of the address in the current layer of subtree node is moved to the lower layer of subtree node, a bit next to the k-th bit of the address is immediately moved from the upper layer of subtree node to the current layer of subtree node.

In one implementation, first of all, a basic circuit structure in the binary tree structure may be determined. The basic circuit structure includes: address bits and data bits of one subtree node and data bits of two child nodes in the lower layer of the one subtree node;

starting from the first layer of subtree node, executing repeatedly a first basic quantum circuit corresponding to the basic circuit structure, so as to move the k-th bit of the address stored in data bits of the subtree node in the basic circuit structure to data bits of two child nodes in the lower layer, until the k-th bit of the address is moved to a data bit of the k-th layer of the subtree node, swapping the quantum state of the data bits of the subtree node of the k-th layer with the quantum state of the address bits of the subtree node, so as to move the k-th bit of the address to the address bit of the subtree node of the k-th layer.

In practical applications, for a binary tree with the height of N (number of layers of subtree nodes), starting from the root, the N-th bit in the N-bits address is moved to the D-Qubit, and the value in D is moved to m0 and m1. Afterwards, for the basic block containing m0 or m1, respectively, the value in D is moved to m0 and m1 in the lower layer, until it is moved to the D-bit of the subtree node in the last layer, i.e., the N-th layer. Finally, data is moved from D to A-bit, by swapping the value of A with that of D. The next step is to move the (N−1)-th bit to the (N−1)-th layer . . . until the 1st bit is moved to the 1st layer.

In one of the embodiments, the process can be performed in a staggered way. When the address bit has been moved from the first layer to the second layer, the process of moving the next address bit to the first layer can be started immediately, so that the time length required for the entire moving step does not exceed the time for the N-th bit address to be moved to the N-th layer.

Figure 5:
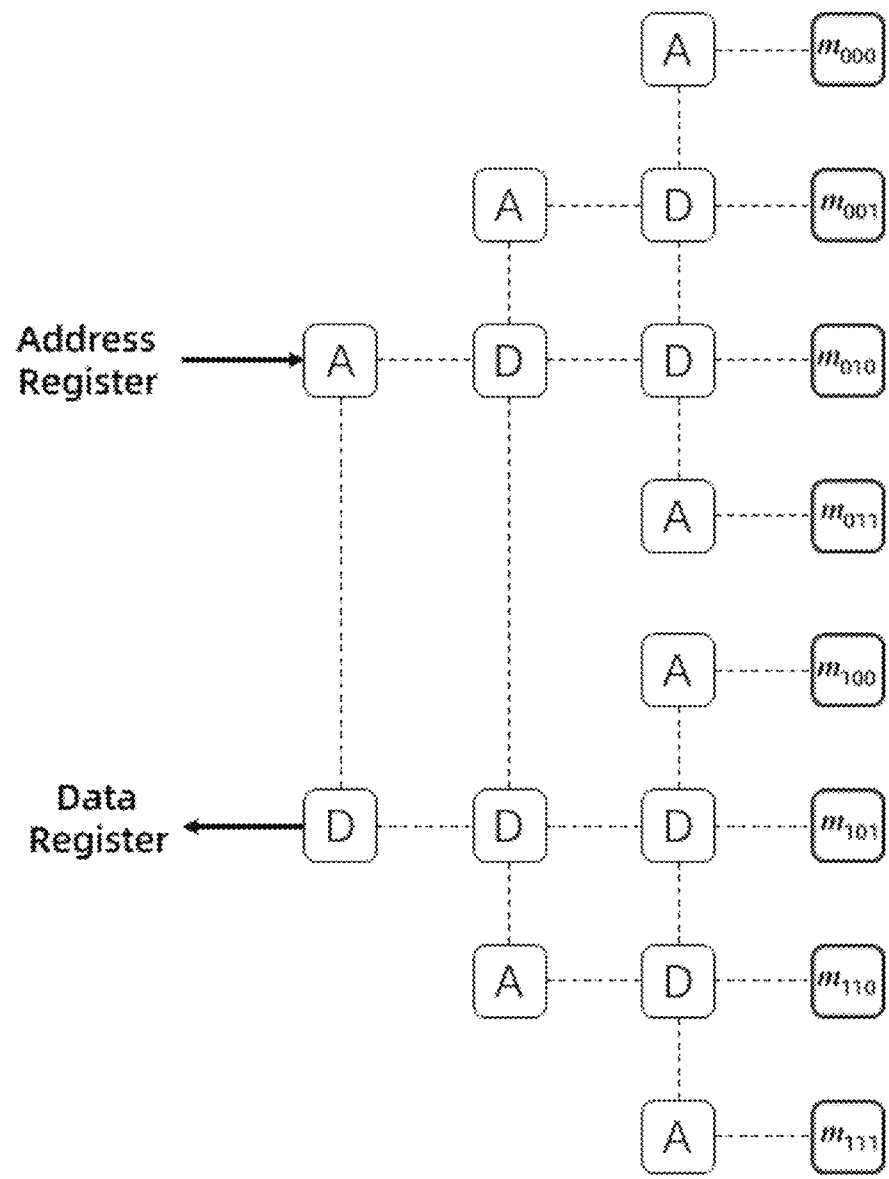
FIG. 5 is a schematic architectural illustration of a 3-subtree-layer QRAM provided in an embodiment of the present application.

FIG. 5 exemplarily shows the topology of a QRAM architecture, which includes 3 layers of subtree nodes and 1 layer of leaf nodes. Qubits in each initial subtree node may be set to the 0 state, where m000, m001 . . . m111 are data stored in the leaf node. The leaf node may include a data bit, whose type may be qubit or classical bit. An Address Register represents an address bit; a Data Register represents a data bit.

Due to the superposition characteristics of quantum, a quantum state is a superposition state of one group of eigenstates, for example: a 3-bit quantum state $|f\rangle = b_0|000\rangle + b_1|001\rangle + b_2|010\rangle + b_3|011\rangle + b_4|100\rangle + b_5|101\rangle + b_6|110\rangle + b_7|111\rangle$, wherein $|000\rangle$, $|001\rangle$, . . . , $|111\rangle$ are eigenstates, the number is 2 to the power of 3, and wherein $b_0$ . . . $b_7$ represents the amplitude (probability amplitude), satisfying $|b_0|^2+|b_1|^2+|b_2|^2+|b_3|^2+|b_4|^2+|b_5|^2+|b_6|^2=1$, wherein the $|\rangle$ is the Dirac symbol. It is in a determined state when probability amplitudes of other states are all 0.

Assuming a received quantum state address $|f\rangle=|101\rangle$, from right to left thereof is the $3^{rd}$ bit to the $1^{st}$ bit, the amplitude of $|101\rangle$ being 1. First of all, move the $3^{rd}$ bit address "1" to the D-bit of the first layer of subtree node, execute a first basic quantum circuit (sub-circuit a) corresponding to a Basic Block spanning the first layer and the second layer, and move the address "1" to two D-bits in the second layer. Next, execute a first basic quantum circuit "a" corresponding to two Basic Blocks spanning the second layer and the third layer, and then move the address "1" to the 4 D-bits in the third layer. Finally, you may use a SWAP gate or an equivalent quantum logic gate to swap the quantum states of the A-bit(s) and the D-bit(s) located in the same subtree node, and move the address "1" to the four A-bits in the third layer. At this time, the quantum state of the four 4 A-bits in the third layer is "1" state.

Figure 6:
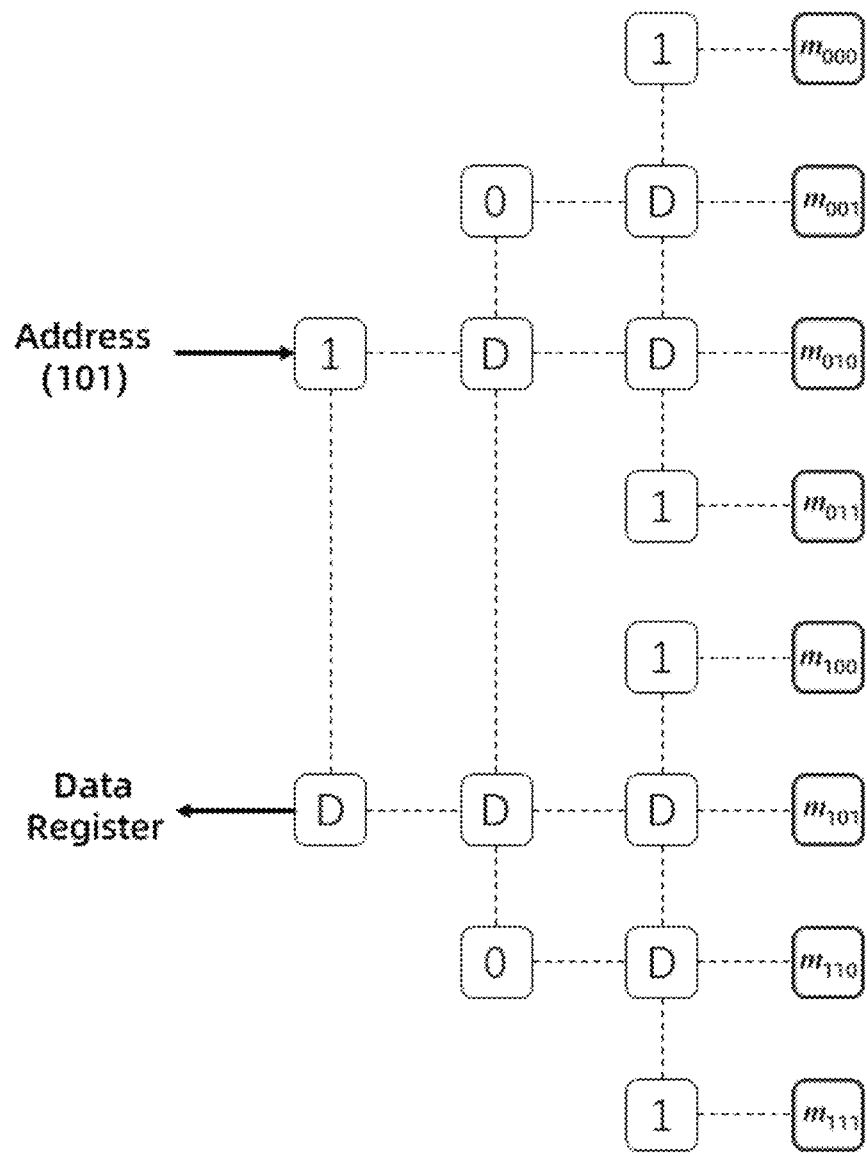
FIG. 6 is a schematic architectural illustration of another 3-subtree-layer QRAM provided in an embodiment of the present application.

For the same reason, the $2^{nd}$ bit "0" of the address is finally moved to two A-bits in the $2^{nd}$ layer, and the $1^{st}$ bit "1" of the address is finally moved to one A-bit in the $2^{nd}$ layer. Finally, the result as shown in FIG. 6 is achieved, where the address $|101\rangle$ is propagated onto the A-bits of layers 1 to 3. In one embodiment, the propagation process can be performed in a staggered manner, for example, when the $3^{rd}$ address bit "1" is moved from layer 2 to layer 3, the next address bit "0" is moved from the $1^{st}$ layer to layer 2 at the same time.

S207, starting from the leaf node, moving, according to an address stored in address bits of each layer of subtree node, data stored in the leaf node to data bits of the upper layer of subtree node, until data corresponding to the address is output at a subtree node at the root of the binary tree structure.

Specifically, starting from the leaf node, executing repeatedly a second basic quantum circuit corresponding to the basic circuit structure, to move data stored in the leaf node to data bits of the upper layer of subtree node, until data corresponding to the address is obtained and output at data bits of subtree node at the root of the binary tree structure; wherein the data moved to a data bit of the subtree node in the upper layer is determined from the address stored in address bits included in the basic circuit structure.

This process may be called "data copy". Now, starting from the leaf node of the leaf part, a basic circuit structure of each Basic Block executes a corresponding second basic quantum circuit (sub-circuit b) Execution on each layer is carried out immediately before execution on the lower layer thereof. The function of the "sub-circuit b" is to move data from a child node to a parent node. Since the address is stored in the A-bit, the data moving process of each layer must retain the correct data required. Therefore, what moved to the D-bits of the subtree node at the root is definitely the data bit indicated by the address, thereby successfully extracting the data.

Exemplarily, continue to take FIG. 6 as an example, which shows that an address 101 is stored. At this time, two leaf nodes and a subtree node of the upper layer constitute a basic circuit structure. A second basic quantum circuit "c" corresponding to 4 Basic Blocks spanning the third layer and the leaf layer are simultaneously executed. Here, in the first Basic Block from the top, since the "A" of the parent node is the third bit "1" of the address, the data m001 (the third bit of the subscript of the data is "1") in the two child nodes is moved to the "D" of the parent node. Similarly, in the second, third, and fourth Basic Blocks, the data being moved are m011, m101, and m111. Finally, the D-bits of the subtree nodes in the third layer reads out four data m001, m011, m101, and m111, wherein the third bits of the subscripts of these data are all "1" (corresponding to the third bit "1" of the written address 101).

Next, a second basic quantum circuits "c" corresponding to the two Basic Blocks spanning the second layer and the third layer is executed. Here, in the first Basic Block above, since the "A" of the parent node is the second bit "0" of the address, the data m001 (the second bit of the subscript of the data is "0") in the two child nodes is moved to the "D" of the parent node. Similarly, in the second Basic Block, the data to be moved is m101. Finally, the D-bits of the subtree nodes in the second layer reads out two data m001 and m101, wherein the second bits of the subscripts of these data are "0" (corresponding to the second bit "0" of the written address 101).

Figure 7:
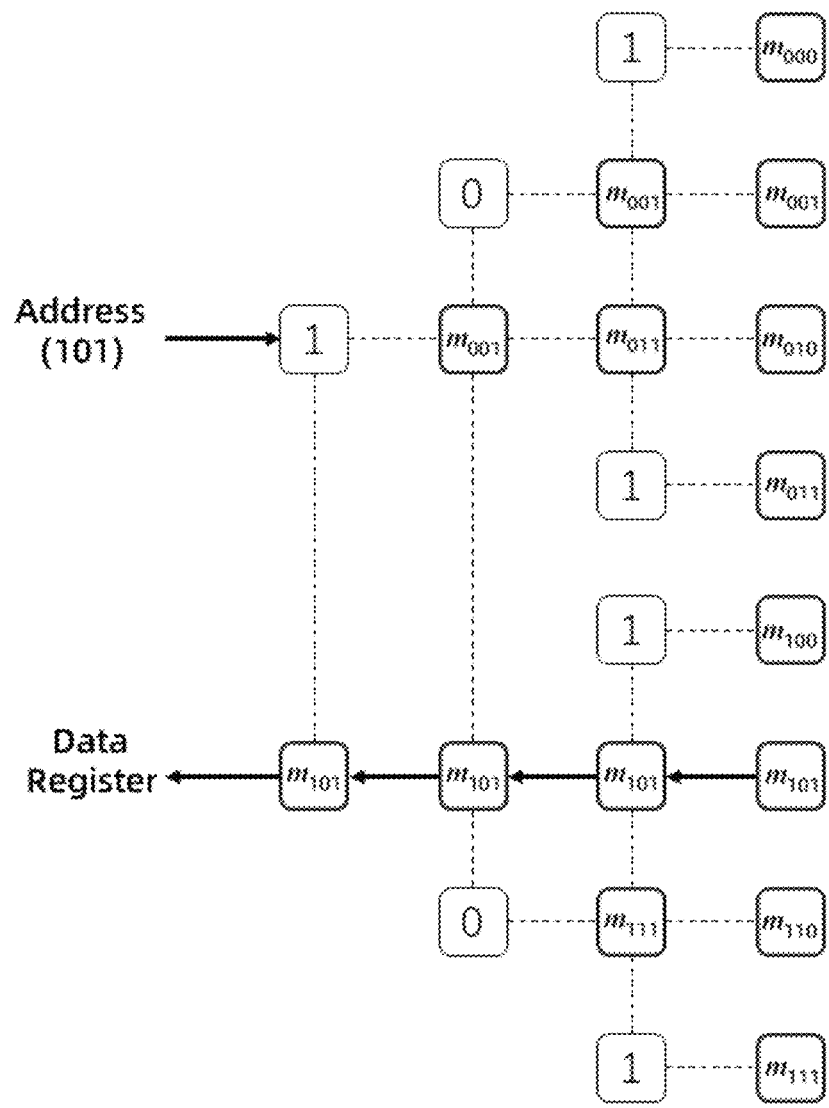
FIG. 7 is a schematic architectural illustration of another 3-subtree-layer QRAM provided in an embodiment of the present application.

Finally, a second basic quantum circuit "c" corresponding to a Basic Block spanning the first layer and the second layer is executed. Here, since the "A" of the parent node is the first bit "1" of the address, the data m101 (the first bit of the subscript of the data is 1) in the two child nodes is moved to the "D" of the parent node. Finally, the D-bits of the subtree nodes at the root in the first layer reads out two data m101, wherein the second bits of the subscripts of these data are "1" (corresponding to the first bit "1" of the written address 101), thereby realizing reading and outputting of the data m101 which corresponds to the quantum state address |101>, as shown in FIG. 7.

This process needs to execute the "sub-circuit c" for N times, and the required time=3Nt+Nt', where t' is the time length required for a Toffoli gate. The aforementioned execution of a propagation requires a time of 4Nt, where t is the time length required for the execution of a CNOT gate.

Specifically, in a practical application, after outputting the data corresponding to the address at the subtree node of the root of the binary tree structure, uncomputing can be executed on the QRAM architecture, so as to restore the QRAM architecture to its original state.

Although the entire system architecture has taken out the data, it has not yet restored the original state. Restoring the original state is very important, because a query in a quantum algorithm often needs to be executed many times. Accordingly, our uncomputing process is to perform the data copy and propagation process in a reversed way, so as to restore the whole system to its original state. The total computing time required is $N(14t+2t')$.

Specifically, the data stored in the leaf node includes a multi-bit number, wherein parent nodes of each leaf node corresponding to each bit of the multi-bit number are all different.

Alternatively, the data stored in the leaf node includes a plurality of multi-bit numbers, wherein continuous storage is executed for identical bits of the plurality of multi-bit numbers, and parent nodes of each one leaf node corresponding to each one bit of each multi-bit number are all different.

For the storage and reading of multi-bit data, the same architecture as before and a new memory storage method can be adopted. That is, when a multi-bit number needs to be stored, each bit of this number can be distributed to a different location for storage, so that parent nodes of each one leaf node corresponding to each one bit of the multi-bit number are all different. If 1024 64-bit floating-point numbers are to be stored, you only need to store all the 0-th bit of these 1024 numbers, and then store all the $1^{st}$ bits, . . . , so that parent nodes of each one leaf node corresponding to each one bit of the multi-bit number are all different.

When reading, due to the parallel characteristics of quantum, starting from the last layer of nodes, in the first log (1024)=10 steps, each bit of the multi-bit number can be taken out in parallel, because each one bit of the multi-bit number is in a different Basic Block. Accordingly, all the numbers you want are obtained on (log(64)=6)-th layer. Then, these data are taken out in turn. Finally, the uncomputing process is accomplished. Therefore, storing data in this way may realize simultaneous parallel processing of all bits of all numbers, realizing a certain acceleration effect as compared with continuous storage. Here, "continuous storage" means to continuously store the 0-th bit to the last bit of one number, and then continuously store the 0-th bit to the last bit of another number, and so on.

It can be seen that by proposing a valid design of a QRAM physical architecture which may be realized in an ideal noise-free physical system and has demands for planar and nearest neighbor interaction, which demands are only on the arrangement of qubits. Such a QRAM does not exceed the order of O(log(N)) in the running time length thereof, and therefore it can fully meet the demands of quantum algorithms. Moreover, a quantum circuit based on a QRAM only uses the most basic quantum logic gates that can be realized reasonably, so as to realize the function of storing an address and reading data in the form of quantum states, and to speed up the analysis and verification of complex quantum algorithms.

Refer to FIG. 8, FIG. 8 is a device for constructing a quantum circuit of a QRAM architecture provided in an embodiment of the present application. the QRAM architecture being configured for accessing data and being a binary tree structure, the QRAM architecture including N layers of subtree node and one layer of leaf node, the subtree node including address bits and first data bits, the leaf node including second data bits for storing data, the N being an address length for writing into the QRAM architecture, the device including:

a circuit structure partitioning module 801, configured for partitioning the binary tree structure into basic circuit structures, wherein a basic circuit structure includes address bits and data bits of one subtree node and data bits of two child nodes in the lower layer of the one subtree node;

a qubit determining module 802, configured for determining qubits required for a basic quantum circuit to be constructed, according to qubits included in the basic circuit structure;

a bit relationship determining module 803, configured for determining an input and an output of the basic quantum circuit to be constructed, according to action relationships between the qubits required for the basic quantum circuit to be constructed; and a quantum circuit determining module 804, configured for constructing a basic quantum circuit corresponding to the basic circuit structure, according to the input and the output using the required qubits and quantum logic gates.

Further, the qubit determining module is also configured for:
determining one by one the qubits included in the basic circuit structure as qubits required for the basic quantum circuit to be constructed.

Further, the bit relationship determining module specifically includes:
a bit relationship acquiring unit, configured for: acquiring action relationships between the qubits required for the basic quantum circuit to be constructed, according to implemented functionalities of the basic circuit structure; and
a bit relationship determining unit, configured for: determining an input and an output of the basic quantum circuit to be constructed, according to action relationships between the qubits required for the basic quantum circuit to be constructed.

Further, the bit relationship determining module also includes:
a first relationship determining unit, configured for: when the action relationship between qubits included in the basic circuit structure is a first action relationship, an input and an output of a first basic quantum circuit to be constructed are determined as follows: an output and an input of address bits of one subtree node remain unchanged, an input of data bits of the subtree node is one address bit and an output of the data bits of the subtree node is |0>, inputs of data bits of two child nodes of the lower layer are both |0>, outputs of data bits of the two child nodes of the lower layer are both the address bit; and
a second relationship determining unit, configured for: when the action relationship between qubits included in the basic circuit structure is a second action relationship, an input and an output of a second basic quantum circuit to be constructed are determined as follows: an input of address bits of one subtree node is one address bit, an output of the address bits of the one subtree node remains unchanged, inputs of data bits of two child nodes of the lower layer are respectively a first data and a second data, outputs of the data bits of the two child nodes of the lower layer remain unchanged, an input of data bits of the subtree node is |0>, and an output of the data bits of the subtree node is determined by the address bit and is the first data or the second data.

Further, the quantum circuit determining module specifically includes:
- a first circuit constructing unit, configured for: when the input and the output are determined to be the input and the output of the first basic quantum circuit to be constructed, a CNOT gate acting on the qubits included in the basic circuit structure is constructed, so as to acquire a first basic quantum circuit corresponding to the basic circuit structure; and
- a second circuit constructing unit, configured for: when the input and the output are determined to be the input and the output of the second basic quantum circuit to be constructed, a Toffoli gate acting on the qubits included in the basic circuit structure is constructed, or a NOT gate, a CNOT gate and a Toffoli gate acting on the qubits included in the basic circuit structure are constructed, so as to acquire a second basic quantum circuit corresponding to the basic circuit structure.

Further, the device also includes:
- an address receiving module, configured for receiving the address represented by a quantum state;
- an address parsing module, configured for: parsing the address, and moving each bit of the address respectively to address bits of subtree node of a corresponding layer;
- wherein each one bit of the address corresponds to one respective layer of the N layers of subtree node; and
- a data outputting module, configured for: starting from the leaf node, moving, according to an address stored in address bits of each layer of subtree node, data stored in the leaf node to data bits of the upper layer of subtree node, until data corresponding to the address is output at a subtree node at the root of the binary tree structure.

Further, the address parsing module is specifically configured for:
- for each bit of the address, starting from k=N, moving the k-th bit of the address to the first layer of subtree node at the root of the binary tree structure;
- starting from the first layer of subtree node, executing repeatedly moving of the k-th bit of the address in the current layer of subtree node to the lower layer of subtree node, until it is moved to the address bits of the subtree node of the k-th layer, wherein the k is a positive integer taking values sequentially from N to 1.

It can be seen that, with a valid quantum circuit of a QRAM architecture proposed, the function of writing an address in the form of a quantum state, and reading data can be realized, thereby speeding up analysis and verification of complex quantum algorithms.

An embodiment of the present application also provides a storage medium having a computer program stored therein, wherein the computer program is configured to perform during execution thereof the method of any one of the method embodiments described above.

Specifically, in this embodiment, the above-mentioned storage medium may be configured to store a computer program for performing the following steps:
S1, partitioning the binary tree structure into basic circuit structures, wherein a basic circuit structure includes address bits and data bits of one subtree node and data bits of two child nodes in the lower layer of the one subtree node;
S2, determining qubits required for a basic quantum circuit to be constructed, according to qubits included in the basic circuit structure;
S3, determining an input and an output of the basic quantum circuit to be constructed, according to action relationships between the qubits required for the basic quantum circuit to be constructed; and
S4, constructing a basic quantum circuit corresponding to the basic circuit structure, according to the input and the output using the required qubits and quantum logic gates.

An embodiment of the present application also provides an electronic device, including: a memory having a computer program stored therein, and a processor, configured to execute the computer program to perform the method of any one of the method embodiments described above.

Specifically, the electronic device may further include a transmission device and an I/O device, wherein the transmission device is connected to the processor, and the I/O device is connected to the processor.

Specifically, in this embodiment, the processor may be configured to perform the following steps via the computer program:
S1, partitioning the binary tree structure into basic circuit structures, wherein a basic circuit structure includes address bits and data bits of one subtree node and data bits of two child nodes in the lower layer of the one subtree node;
S2, determining qubits required for a basic quantum circuit to be constructed, according to qubits included in the basic circuit structure;
S3, determining an input and an output of the basic quantum circuit to be constructed, according to action relationships between the qubits required for the basic quantum circuit to be constructed; and
S4, constructing a basic quantum circuit corresponding to the basic circuit structure, according to the input and the output using the required qubits and quantum logic gates.

Referring to FIG. 9, FIG. 9 is a schematic flowchart of a method for parsing quantum address data. Based on the schematic flowchart, this embodiment provides a method for parsing quantum address data, applied to a pre-built quantum random storage access (QRAM) architecture for accessing data, the QRAM architecture including at least one layer of subtree nodes, each layer of subtree nodes includes corresponding address bits.

Specifically, a QRAM is a memory system for quantum computers, and is a quantum version of a classical computer RAM. A QRAM can be used for creating a quantum superposition state containing information. In contrast to a RAM which needs to read data one by one, a QRAM can read superimposed data with a superposition address. For example, to store e0, e1, . . . , e(n−1) in the address [0, N): if you use a classical RAM, input the address i, and output the data e_i; if you use a quantum version of the classical RAM, i.e., a QRAM, you can input the following quantum state as the address:

$\Sigma |i\rangle$

Obtain following output using QRAM:

$$\Sigma |i\rangle |e_i\rangle$$

Such a process of inputting an address and outputting data may be called a "query" or an "access".

Specifically, the method for parsing quantum address data may include the following steps:

S901. when receiving a target quantum address, sequentially acquiring each quantum address data in the target quantum address according to a preset data bit acquisition rule;

In this embodiment, before reading the data stored in the QRAM, initialization is required. This "initialization" is actually the writing process of the QRAM, during which data is imported one by one. Then a quantum address is handed down to the QRAM, the QRAM parses the received address. Here, the entire QRAM is a binary tree structure. As shown in FIG. 3, each small block in the figure represents a Qubit (quantum bit). A Qubit includes: A-bit, i.e., address bit (Address Qubit); D-bit, i.e., data bit (Data Qubit), wherein the address bit "A" is configured to store quantum address bit data, and the data bit "D" is configured for swapping. All the nodes constitute the QRAM architecture of binary tree structure. An A-bit and a D-bit vertically adjacent thereto constitute a group called a "node", which is a basic unit in a binary tree. One node and D-bits (respectively referred to as m0 and m1) in its two child nodes constitute a Basic Block. A Basic Block includes 4 bits, and is a basic circuit structure spanning two layers. The root of the binary tree is the output part of the QRAM. The leaf nodes are located at the last layer of the binary tree, and are configured to store data, that is to record a binary data bit. For example, for a QRAM with an address length of N (such as typical data word lengths, 32 bits, 64 bits, etc.), the maximum addressing space of the QRAM is from 0 to $2^N-1$. Such a QRAM has a total of N layers of subtree node plus the last one layer of leaf node, wherein the leaf nodes at the last one layer can store up to $2^N$ binary bits. In a specific example, the definition thereof may be expanded according to the "byte" (1 byte=8 bits) of classical computers in the prior art, where $2^{(3+N)}$ binary bits need to be stored for an N-bit QRAM, corresponding to a binary tree with the height of 3+N. Specifically, a preset rule may be from low to high, or from high to low. In a specific embodiment, the user can preset the corresponding relationship between the address data bits and the child nodes of a layer of the QRAM architecture according to actual needs. When the target quantum address corresponding to the target data to be read is received, since the current customary sequence is to write address bits from low to high, each quantum address data in the target quantum address is sequentially acquired from low to high.

S902. sequentially moving through a preset quantum circuit each quantum address data respectively to address bits of subtree nodes of a corresponding layer in the QRAM architecture, so as to complete the parsing of the target quantum address; wherein the preset quantum circuit is constructed through the above method of constructing a quantum circuit of a QRAM architecture.

Compared with the prior art, a method for parsing quantum address data is applied to a pre-built quantum random storage access (QRAM) architecture for accessing data, the QRAM architecture including at least one layer of subtree nodes, each layer of subtree nodes includes corresponding address bits, the method for parsing quantum address data includes: when receiving a target quantum address, sequentially acquiring each quantum address data in the target quantum address from low to high;

sequentially moving through a preset quantum circuit each quantum address data respectively to address bits of subtree nodes of a corresponding layer in the QRAM architecture, so as to complete the parsing of the target quantum address. It can be seen that by proposing a method for parsing quantum address data, the method can be applied to a QRAM architecture, and can realize the function of writing an address in the form of quantum states and reading data, thereby speeding up the analysis and verification of complex quantum algorithms.

In this embodiment, each quantum address data corresponding to the target quantum address may be sequentially moved "from low to high" to the address bits of the corresponding layer in the QRAM architecture through a quantum circuit preset according to the function. Thus, after each of the quantum address data corresponding to the target quantum address is sequentially moved to the QRAM architecture from low to high, the parsing of the target quantum address is completed, and the target data stored in the leaf node corresponding to the target quantum address may be determined in the QRAM architecture. Specifically, the quantum circuit used in this application includes a first basic quantum circuit, namely sub-circuit (a), a second basic quantum circuit, namely sub-circuit (b) and a third basic quantum circuit, namely sub-circuit (c). The details are as follows:

As shown in FIG. 4(a), a sub-circuit (a) is used to move the data in D-bits into m0 and m1. It is to be noted that, before running this circuit, the quantum states in m0 and m1 are both guaranteed to be 0 state. After running the sub-circuit (a), the states in the D-bits are 0 state. In a specific embodiment, the sub-circuit (a) uses 4 CNOT gates, which in FIG. 4(a) are indicated by a "⊕" icon on one bit plus a connection line connecting another bit.

As shown in FIG. 4(b), the sub-circuit (b) is configured to selectively move the data of m0 and m1 to the D-bit, according to the state of the A-bit. In the case that the state of A is 0, move the data of m0 to the D through a Toffoli gate; otherwise, in the case that A is 1, move the data of m1 to the D through a Toffoli gate. In a specific embodiment, the sub-circuit (b) includes 2 Toffoli gates. In FIG. 4(b), a Toffoli gate is represented by a "⊕" icon on one bit plus connection lines connecting another two bits, wherein a solid center of the icon indicates actual control, i.e., to execute the quantum logic gate when the quantum state of the bit is 1; and wherein a hollow center of the icon indicates virtual control, i.e., to execute the quantum logic gate when the quantum state of the bit is 0.

In addition, a "sub-circuit c" implements the same function as the "sub-circuit b", i.e., both are configured to selectively move the data of m0 and m1 to the D-bit, according to the state of the A-bit. Since a Toffoli gate is more difficult to control than a CNOT gate, (c) is provided as an optimized version of (b). In a specific embodiment, the sub-circuit (c) uses one Toffoli gate, three CNOT gates and two NOT gates, which are relatively optimized (as the implementation of a Toffoli gate is very complicated), and can be used as equivalent alternatives. Here, a "⊕" icon on one bit indicates a NOT gate. It should be noted that this is not a specific limitation on construction of the basic quantum circuit required by the Basic Block: other quantum circuits that can realize the functions of "sub-circuit a" and "sub-circuit b" also fall within the scope of protection of this application.

With the above basic quantum circuit, the parsing of the target quantum address can be completed.

This embodiment provides a method for parsing quantum address data, applied to a pre-built quantum random storage access (QRAM) architecture for accessing data, the QRAM architecture including at least one layer of subtree nodes, each layer of subtree nodes includes corresponding address bits, the method for parsing quantum address data including: when receiving a target quantum address, sequentially acquiring each quantum address data in the target quantum address according to a preset data bit acquisition rule; sequentially moving through a preset quantum circuit each quantum address data respectively to address bits of subtree nodes of a corresponding layer in the QRAM architecture, so as to complete the parsing of the target quantum address. It can be seen that by proposing a method for parsing quantum address data, the method can be applied to a QRAM architecture, and can realize the function of writing an address in the form of quantum states and reading data, thereby speeding up the analysis and verification of complex quantum algorithms.

Further, the method also includes, before the step S202:
  acquiring numbers of address bits of each quantum address data in the target quantum address, and determining corresponding layer of subtree nodes for each quantum address data in the QRAM architecture according to preset corresponding rules and the numbers of address bits.

Here, a total number of bits of the target quantum address equals to a total number of layers of subtree nodes in the QRAM architecture, both the total number of bits and the total number of layers are N, N being a positive integer, the Step S202 specifically includes:
  acquiring a $0^{th}$ bit of address data in the target quantum address, determining the (N−1)-th layer of subtree nodes in the QRAM architecture, and moving the $0^{th}$ bit of address data to address bits of the (N−1)-th layer of subtree nodes through the preset quantum circuit;
  acquiring the next bit of address data in the target quantum address, and determining the lower layer of subtree nodes in the QRAM architecture, so as to move the next bit of address data, until N address data in the target quantum address are respectively moved to address bits of corresponding N layers of subtree nodes in the QRAM architecture.

In this embodiment, the number of layers of the subtree nodes (excluding the leaf nodes of the last layer) of the QRAM architecture is equal to the address length. As one implementation, the number of address bits in one quantum address data among all the quantum address data, and the corresponding subtree node of the corresponding layer, is always N−1. For example, the $0^{th}$ bit of the quantum address data corresponds to the (N−1)-th layer of subtree nodes of the QRAM architecture, and the (N−1)-th bit of the address data is moved to the address bits of the $0^{th}$ layer of the subtree nodes. Specifically, after each quantum address data is determined, each quantum address data from low to high, are sequentially moved to the address bits of the subtree nodes of the corresponding layer through a preset quantum circuit with corresponding functions.

Further, said step "moving the $0^{th}$ bit of address data to address bits of the (N−1)-th layer of subtree nodes through the preset quantum circuit" further includes:
  moving the $0^{th}$ bit of the address data to data bits of the subtree nodes of the 0th layer of the QRAM architecture;
  moving, through the preset quantum circuit, the $0^{th}$ bit of the address data in the data bits of the subtree nodes of the 0th layer to the data bits of the subtree nodes of the lower layer, until the $0^{th}$ bit of address data is moved to the data bits of subtree nodes of the (N−1)-th layer; and
  swapping the $0^{th}$ bit of the address data stored in the data bits of subtree nodes of the (N−1)-th layer to address bits of the subtree nodes of the (N−1)-th layer.

In this embodiment, due to the characteristics of the QRAM architecture, each quantum address data cannot be directly moved to the address bits: they need to be moved to the data bits of the subtree nodes of each layer first, and then swapped layer by layer to the address bits of the subtree nodes of the corresponding layer. In practical applications, for a binary tree with a height of N (the number of layers of subtree nodes), first of all, starting from the root, move the (N−1)-th bit of the N-bit address to the D bit of the 0th layer subtree node, and then, execute sub-circuit (a) to move the value in D of the 0th layer subtree node to m0 and m1 of the 1st layer subtree node. Then, sub-circuit (a) is executed respectively on the basic blocks containing m0 and m1, so as to move the value in D to the m0 and m1 of the lower layer, thus executing recurrently moving until it is moved to the last layer, i.e., the (N−1)-th layer. Finally, the values of A and D in the (N−1)-th layer are swapped to move the data from the D-bit to the A-bit, thus completing the move of the (N−1)-th bit of address data to the address bits of the (N−1)-th layer of subtree nodes. The next step is to move the (N−2)-th bit to the (N−2)-th layer . . . and continue to execute until the 1st bit is moved to the 1st layer.

Further, said step "acquiring the next bit of address data in the target quantum address, and determining the lower layer of subtree nodes in the QRAM architecture, so as to move the next bit of address data" specifically includes:
  after the $0^{th}$ bit of the address data in the data bits of the subtree nodes of the $0^{th}$ layer is moved to the data bits of the subtree nodes of the lower layer, moving through the preset quantum circuit the $1^{st}$ bit of the address data to the data bits of the subtree nodes of the $0^{th}$ layer of the QRAM architecture, so as to execute moving of the address data in the target quantum address in a staggered way; and
  moving, through the preset quantum circuit, the $1^{st}$ bit of the address data in the data bits of the subtree nodes of the $0^{th}$ layer to data bits of subtree nodes of the lower layer, until the $1^{st}$ bit of the address data is moved to data bits of subtree nodes of the (N−2)-th layer.

In this embodiment, in order to improve data parsing efficiency, the above data moving process may be executed in a staggered way. When the address bit has been moved from the $0^{th}$ layer to the $1^{st}$ layer, the process of moving the next address bit to the $1^{st}$ layer can be started immediately, so that the time length required for the entire moving step does not exceed the time for the N-th bit address to be moved to the N-th layer. Specifically, when the address bit is being moved from the $0^{th}$ layer to the $1^{st}$ layer, the process of moving the next address bit from the $0^{th}$ layer to the $1^{st}$ layer can be started, so that the time length required for the entire moving step does not exceed the time for the (N−1)-th bit address to be moved to the last layer. That is, when the 0th bit of address data in the data bits of the subtree nodes of the 0th layer is moved to the data bits of the lower layer subtree node, the 1st bit of address data is acquired from the target quantum address, the (N−2)-th layer of subtree node is determined in the QRAM architecture, and move the first bit address data to the data bits of the (N−2)-th layer of subtree nodes in the QRAM architecture through the preset quantum circuit, thereby executing the moving of the address data in the target quantum address in a staggered way. Therefore, it is guaranteed that execution of one propagation requires a time length of 4Nt, where t is the time length required for the execution of a CNOT gate.

Further, the QRAM architecture further includes a leaf node connected to subtree nodes of the (N−1)-th layer, the leaf node further includes data bits of the leaf node for storing data, the method further includes, after said "sequentially moving through a preset quantum circuit each quantum address data respectively to address bits of subtree nodes of a corresponding layer in the QRAM architecture, so as to complete the parsing of the target quantum address":

starting from the leaf node, moving, according to said each quantum address data stored in address bits of each layer of subtree node, target data stored in data bits of the leaf node to data bits of the upper layer of subtree node, until target data corresponding to the target quantum address is output at a subtree node at the root of the binary tree structure.

In this embodiment, after the target quantum address is parsed, the leaf node corresponding to the specific subtree node of the target data in the QRAM architecture may be determined. Then, starting from the leaf node, execute the sub-circuit (c) for each basic block, so as to move the data stored in the leaf node to the data bits of the upper layer of subtree nodes, until target data corresponding to the target quantum address is acquired and output at data bits of a subtree node at the root of the binary tree structure; wherein, the data moved to the data bits of the subtree node of the upper layer is determined by the address stored in address bits included in the corresponding basic circuit structure. The address data can be stored in the A bit in advance, thereby ensuring that the data moving process for each layer can retain the correct required data. Accordingly, it is moved to the D bit at the root, that is, the data bit indicated by the target quantum address, completing the extraction of the target data. Here, data stored in the leaf node is a multi-bit number, wherein parent nodes of leaf nodes corresponding to each bit of the multi-bit number are all different. Alternatively, data stored in the leaf node are a plurality of multi-bit numbers, wherein continuous storage is executed for identical bits of the plurality of multi-bit numbers, and parent nodes of each one leaf node corresponding to each one bit of each multi-bit number are all different. In a specific embodiment, this data extracting process needs to execute the sub-circuit (c) for N times, requiring a time length of 3Nt+Nt', where t' is the time length required for a Toffoli gate.

FIG. 5 exemplarily shows the topology of a QRAM architecture, which includes 3 layers of subtree nodes and 1 layer of leaf nodes. Qubits in each initial subtree node may be set to the 0 state, where m000, m001 . . . m111 are data stored in the leaf node. The leaf node may include a data bit (that is, the second data bit), whose type may be qubit or classical bit. An Address Register represents an address bit; a Data Register represents a data bit.

Due to the superposition characteristics of quantum, a quantum state is a superposition state of one group of eigenstates, for example: a 3-bit quantum state $|f\rangle = b_0|000\rangle + b_1|001\rangle + b_2|010\rangle + b_3|011\rangle + b_4|100\rangle + b_5|101\rangle + b_6|110\rangle + b_7|111\rangle$, wherein $|000\rangle$, $|001\rangle$, . . . , $|111\rangle$ are eigenstates, the number is 2 to the power of 3, and wherein b0 . . . b7 represents the amplitude (probability amplitude), satisfying $|b_0|^2+|b_1|^2+|b_2|^2+|b_3|^2+|b_4|^2+|b_5|^2+|b_6|^2+|b_7|^2=1$, wherein the $|\rangle$ is the Dirac symbol. It is in a determined state when probability amplitudes of other states are all 0.

Assuming a received quantum state address $|f\rangle=|101\rangle$, from right to left thereof is the $3^{rd}$ bit to the $1^{st}$ bit, the amplitude of $|101\rangle$ being 1. First of all, move the $3^{rd}$ bit address "1" to the D-bit of the first layer of subtree node, execute a second preset quantum circuit corresponding to a Basic Block spanning the first layer and the second layer, and move the address "1" to two D-bits in the second layer. Next, execute a second preset quantum circuit corresponding to two Basic Blocks spanning the second layer and the third layer, and then move the address "1" to the 4 D-bits in the third layer. Finally, you may use a SWAP gate or an equivalent quantum logic gate to swap the quantum states of the A-bit(s) and the D-bit(s) located in the same subtree node, and move the address "1" to the four A-bits in the third layer. At this time, the quantum state of the four 4 A-bits in the third layer is "1" state.

For the same reason, the $2^{nd}$ bit "0" of the address is finally moved to two A-bits in the $2^{nd}$ layer, and the $1^{st}$ bit "1" of the address is finally moved to one A-bit in the $2^{nd}$ layer. Finally, the result as shown in FIG. 6 is achieved, where the address $|101\rangle$ is propagated onto the A-bits of layers 1 to 3. In one embodiment, the propagation process can be performed in a staggered manner, for example, when the $3^{rd}$ address bit "1" is moved from layer 2 to layer 3, the next address bit "0" is moved from layer 1 to layer 2 at the same time.

Further, after parsing the quantum address data, the method further includes:

starting from the leaf node, moving, according to an address stored in address bits of each layer of subtree node, data stored in the leaf node to data bits of the upper layer of subtree node, until data corresponding to the address is output at a subtree node at the root of the binary tree structure.

Specifically, starting from the leaf node, executing repeatedly a second basic quantum circuit corresponding to the basic circuit structure, to move data stored in the leaf node to data bits of the upper layer of subtree node, until data corresponding to the address is obtained and output at data bits of subtree node at the root of the binary tree structure; wherein the data moved to a data bit of the subtree node in the upper layer is determined from the address stored in address bits included in the corresponding basic circuit structure.

This process may be called "data copy". Now, starting from the leaf node of the leaf part, a basic circuit structure of each Basic Block executes a corresponding second basic quantum circuit (sub-circuit b) Execution on each layer is carried out immediately before execution on the lower layer thereof. The function of the "sub-circuit b" is to move data from a child node to a parent node. Since the address is stored in the A-bit, the data moving process of each layer must retain the correct data required. Therefore, what moved to the D-bits of the subtree node at the root is definitely the data bit indicated by the address, thereby successfully extracting the data.

Exemplarily, continue to take FIG. 6 as an example, which shows that an address 101 is stored. At this time, two leaf nodes and a subtree node of the upper layer constitute a basic circuit structure. A second basic quantum circuit "c" corresponding to 4 Basic Blocks spanning the third layer and the leaf layer is simultaneously executed. Here, in the first Basic Block from the top, since the "A" of the parent node is the third bit "1" of the address, the data m001 (the third bit of the subscript of the data is "1") in the two child nodes is moved to the "D" of the parent node. Similarly, in the second, third, and fourth Basic Blocks, the data being moved are m011, m101, and m111. Finally, the D-bits of the subtree nodes in the third layer reads out four data m001, m011, m101, and m111, wherein the third bits of the subscripts of these data are all "1" (corresponding to the third bit "1" of the written address 101).

Next, second basic quantum circuits "c" corresponding to the two Basic Blocks spanning the second layer and the third layer are executed. Here, in the first Basic Block above, since the "A" of the parent node is the second bit "0" of the address, the data m001 (the second bit of the subscript of the data is "0") in the two child nodes is moved to the "D" of the parent node. Similarly, in the second Basic Block, the data to be moved is m101. Finally, the D-bits of the subtree nodes in the second layer reads out two data m001 and m101, wherein the second bits of the subscripts of these data are "0" (corresponding to the second bit "0" of the written address 101).

Finally, a second basic quantum state corresponding to a Basic Block spanning the first layer and the second layer is executed. Here, since the "A" of the parent node is the first bit "1" of the address, the data m101 (the first bit of the subscript of the data is 1) in the two child nodes is moved to the "D" of the parent node. Finally, the D-bits of the subtree nodes at the root in the first layer reads out two data m101, wherein the second bits of the subscripts of these data are "1" (corresponding to the first bit "1" of the written address 101), thereby realizing reading and outputting of the data m101 which corresponds to the quantum state address |101>, as shown in FIG. 7.

This process needs to execute the "sub-circuit c" for N times, requiring a time length of $3Nt+Nt'$, where $t'$ is the time length required for a Toffoli gate. The aforementioned execution of a propagation requires a time of $4Nt$, where $t$ is the time length required for the execution of a CNOT gate.

Further, the method also includes, after said step "target data corresponding to the target quantum address is output at a subtree node at the root of the binary tree structure":

executing uncomputing on the QRAM structure to restore the QRAM structure to its initial state.

In this embodiment, after the data parsing and data extraction operations are performed, the QRAM architecture is not yet restored to its original state, and the correct extraction of data next time cannot be guaranteed. As a result, the entire QRAM architecture can be restored to its original state by performing the data copy and data parsing (i.e., data propagation) processes in a reversed way, and the uncomputing processing of the QRAM architecture is completed.

Specifically, in a practical application, after outputting the data corresponding to the address at the subtree node of the root of the binary tree structure, uncomputing can be executed on the QRAM architecture, so as to restore the QRAM architecture to its original state.

Although the entire system architecture has taken out the data, it has not yet restored the original state. Restoring the original state is very important, because a query in a quantum algorithm often needs to be executed many times. Accordingly, our uncomputing process is to perform the data copy and propagation process in a reversed way, so as to restore the whole system to its original state. The total computing time required is $N(14t+2t')$.

Specifically, the data stored in the leaf node includes a multi-bit number, wherein parent nodes of each leaf node corresponding to each bit of the multi-bit number are all different.

Alternatively, the data stored in the leaf node includes a plurality of multi-bit numbers, wherein continuous storage is executed for identical bits of the plurality of multi-bit numbers, and parent nodes of each one leaf node corresponding to each one bit of each multi-bit number are all different.

For the storage and reading of multi-bit data, the same architecture as before and a new memory storage method can be adopted. That is, when a multi-bit number needs to be stored, each bit of this number can be distributed to a different location for storage, so that parent nodes of each one leaf node corresponding to each one bit of the multi-bit number are all different. If 1024 64-bit floating-point numbers are to be stored, you only need to store all the 0-th bit of these 1024 numbers, and then store all the $1^{st}$ bits, ..., so that parent nodes of each one leaf node corresponding to each one bit of the multi-bit number are all different.

When reading, due to the parallel characteristics of quantum, starting from the last layer of nodes, in the first $\log_2(1024)=10$ steps, each bit of the multi-bit number can be taken out in parallel, because each one bit of the multi-bit number is in a different Basic Block. Accordingly, all the numbers you want are obtained on $(\log_2(64)=6)$-th layer. Then, these data are taken out in turn. Finally, the uncomputing process is accomplished. Therefore, storing data in this way may realize simultaneous parallel processing of all bits of all numbers, realizing a certain acceleration effect as compared with continuous storage. Here, "continuous storage" means to continuously store the 0-th bit to the last bit of one number, and then continuously store the 0-th bit to the last bit of another number, and so on.

It can be seen that by proposing a valid design of a QRAM physical architecture which may be realized in an ideal noise-free physical system and has demands for planar and nearest neighbor interaction, which demands are only on the arrangement of qubits. Such a QRAM does not exceed the order of $O(\log(N))$ in the running time length thereof, and therefore it can fully meet the demands of quantum algorithms. Moreover, a quantum circuit based on a QRAM only uses the most basic quantum logic gates that can be realized reasonably, so as to realize the function of storing an address and reading data in the form of quantum states, and to speed up the analysis and verification of complex quantum algorithms.

Figure 10:
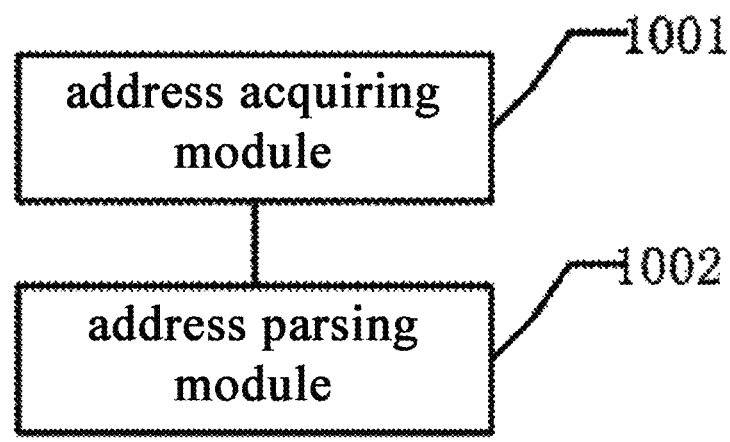
FIG. 10 is a schematic structural illustration of a device for parsing quantum address data.

Referring to FIG. 10, FIG. 10 is a schematic structural illustration of a device for parsing quantum address data, applied to a pre-built quantum random storage access (QRAM) architecture for accessing data, the QRAM architecture including at least one layer of subtree nodes, each layer of subtree nodes includes corresponding address bits, the device including:

an address acquiring module 1001, configured for: when receiving a target quantum address, sequentially acquiring each quantum address data in the target quantum address according to a preset data bit acquisition rule; and an address parsing module 1002, configured for: sequentially moving through a preset quantum circuit each quantum address data respectively to address bits of subtree nodes of a corresponding layer in the QRAM architecture, so as to complete the parsing of the target quantum address.

Further, the device also includes:
a data determining module, configured for: acquiring numbers of address bits of each quantum address data in the target quantum address, and determining corresponding layer of subtree nodes for each quantum address data in the QRAM architecture according to preset corresponding rules and the numbers of address bits.

Further, a total number of bits of the target quantum address equals to a total number of layers of subtree nodes in the QRAM architecture, both the total number of bits and the total number of layers are N, N being a positive integer, the address parsing module 1002 specifically includes:
a first moving unit, configured for: acquiring a $0^{th}$ bit of address data in the target quantum address, determining the (N−1)-th layer of subtree nodes in the QRAM architecture, and moving the 0th bit of address data to address bits of the (N−1)-th layer of subtree nodes through the preset quantum circuit;
a second moving unit, configured for: acquiring the next bit of address data in the target quantum address, and determining the lower layer of subtree nodes in the QRAM architecture, so as to move the next bit of address data, until N address data in the target quantum address are respectively moved to address bits of corresponding N layers of subtree nodes in the QRAM architecture.

Further, the first moving unit specifically includes:
a first moving subunit, configured for: moving the $0^{th}$ bit of the address data to data bits of the subtree nodes of the 0th layer of the QRAM architecture;
a second moving subunit, configured for: moving, through the preset quantum circuit, the $0^{th}$ bit of the address data in the data bits of the subtree nodes of the 0th layer to the data bits of the subtree nodes of the lower layer, until the $0^{th}$ bit of address data is moved to the data bits of subtree nodes of the (N−1)-th layer; and
a third moving subunit, configured for: swapping the $0^{th}$ bit of the address data stored in the data bits of subtree nodes of the (N−1)-th layer to address bits of the subtree nodes of the (N−1)-th layer.

Further, the second moving unit specifically includes:
a fourth moving subunit, configured for: after the 0th bit of the address data in the data bits of the subtree nodes of the 0th layer is moved to the data bits of the subtree nodes of the lower layer, moving through the preset quantum circuit the $1^{st}$ bit of the address data to the data bits of the subtree nodes of the $0^{th}$ layer of the QRAM architecture, so as to execute moving of the address data in the target quantum address in a staggered way; and
a fifth moving subunit, configured for: moving, through the preset quantum circuit, the $1^{st}$ bit of the address data in the data bits of the subtree nodes of the $0^{th}$ layer to data bits of subtree nodes of the lower layer, until the $1^{st}$ bit of the address data is moved to data bits of subtree nodes of the (N−2)-th layer.

Further, the QRAM architecture also includes a leaf node connected to subtree nodes of the (N−1)-th layer, the leaf node further includes data bits of the leaf node for storing data, the device further includes:
an outputting module, configured for: starting from the leaf node, moving, according to said each quantum address data stored in address bits of each layer of subtree node, target data stored in data bits of the leaf node to data bits of the upper layer of subtree node, until target data corresponding to the target quantum address is output at a subtree node at the root of the binary tree structure.

Further, the device also includes:
an uncomputing module, configured for executing uncomputing on the QRAM structure to restore the QRAM structure to its initial state.

It can be seen that by proposing a valid QRAM architecture, the function of storing an address in the form of a quantum state and reading data can be realized, thereby speeding up the analysis and verification of complex quantum algorithms.

An embodiment of the present application also provides a storage medium having a computer program stored therein, wherein the computer program is configured to perform during execution thereof the method of any one of the method embodiments above.

Specifically, in the present embodiment, the above-mentioned storage medium may be configured to store a computer program for executing the following steps:
S1, when receiving a target quantum address, sequentially acquiring each quantum address data in the target quantum address according to a preset data bit acquisition rule;
S2, sequentially moving through a preset quantum circuit each quantum address data respectively to address bits of subtree nodes of a corresponding layer in the QRAM architecture, so as to complete the parsing of the target quantum address.

Specifically, in this embodiment, the above-mentioned storage medium may include but not limited to: U disk, Read-Only Memory (referred to as ROM), Random Access Memory (referred to as RAM), mobile hard disk, magnetic disk or optical disk and other media that can store computer programs.

An embodiment of the present application also provides an electronic device, including: a memory having a computer program stored therein, and a processor, configured to execute the computer program to perform the method of any one of the method embodiments as mentioned above.

Specifically, the electronic device may further include a transmission device and an I/O device, wherein the transmission device is connected to the processor, and the I/O device is also connected to the processor.

Specifically, in the present embodiment, the above-mentioned processor can be configured to perform, via a computer program, the following steps:
S1, when receiving a target quantum address, sequentially acquiring each quantum address data in the target quantum address according to a preset data bit acquisition rule;
S2, sequentially moving through a preset quantum circuit each quantum address data respectively to address bits of subtree nodes of a corresponding layer in the QRAM architecture, so as to complete the parsing of the target quantum address.

The structure, features and effects of the present disclosure have been described in detail above based on the embodiments shown in the drawings. The above descriptions are only preferred embodiments of the present disclosure, and the present disclosure does not limit the scope of implementation to what is shown in the drawings. Any changes made according to the idea of the present disclosure or modifications to equivalent embodiments that are equivalent changes still within the spirit covered by the description and illustrations, shall fall into the protection scope of the present disclosure.

The invention claimed is:

1. A method for constructing a quantum circuit of a QRAM architecture configured for accessing data and having a binary tree structure, the QRAM architecture comprising a root and N layers of subtree nodes and one layer of a leaf node, the subtree node comprising address bits and first data bits, the leaf node comprising second data bits for storing data, the N being an address length for writing into the QRAM architecture, comprising:
partitioning the binary tree structure into one or more basic circuit structures, wherein each of the one or more basic circuit structures comprising address bits and data bits of one subtree node and data bits of two child nodes in a lower layer of the one subtree node;
determining qubits required for a basic quantum circuit to be constructed, according to qubits included in the basic circuit structure;
determining an input and an output of the basic quantum circuit to be constructed, according to an action relationships between the qubits required for the basic quantum circuit to be constructed; and
constructing a basic quantum circuit corresponding to the one or more basic circuit structures, according to the input and the output using the required qubits and quantum logic gates,
wherein said determining an input and an output of the basic quantum circuit to be constructed, according to action relationships between the qubits required for the basic quantum circuit to be constructed comprises:
when the action relationship between qubits included in the basic circuit structure is a first action relationship, an input and an output of a first basic quantum circuit to be constructed are determined as follows: an output and an input of address bits of one subtree node remain unchanged, an input of data bits of the subtree node is one address bit and an output of the data bits of the subtree node is |0>, inputs of data bits of two child nodes of the lower layer are both |0>, outputs of data bits of the two child nodes of the lower layer are both the address bit; and
when the action relationship between qubits included in the basic circuit structure is a second action relationship, an input and an output of a second basic quantum circuit to be constructed are determined as follows: an input of address bits of one subtree node is one address bit, an output of the address bits of the one subtree node remains unchanged, inputs of data bits of two child nodes of the lower layer are respectively a first data and a second data, outputs of the data bits of the two child nodes of the lower layer remain unchanged, an input of data bits of the subtree node is |0>, and an output of the data bits of the subtree node is determined by the address bit and is the first data or the second data.

2. The method of claim 1, wherein, said determining qubits required for a basic quantum circuit to be constructed, according to qubits included in the basic circuit structure comprises:
determining one by one the qubits included in the basic circuit structure as qubits required for the basic quantum circuit to be constructed.

3. The method of claim 1, wherein, said determining an input and an output of the basic quantum circuit to be constructed, according to action relationships between the qubits required for the basic quantum circuit to be constructed comprises:
acquiring action relationships between the qubits required for the basic quantum circuit to be constructed, according to implemented functionalities of the basic circuit structure; and
determining an input and an output of the basic quantum circuit to be constructed, according to action relationships between the qubits required for the basic quantum circuit to be constructed.

4. The method of claim 1, wherein, said constructing a basic quantum circuit corresponding to the basic circuit structure, according to the input and the output using the required qubits and quantum logic gates comprises:
when the input and the output are determined to be the input and the output of the first basic quantum circuit to be constructed, a CNOT gate acting on the qubits included in the basic circuit structure is constructed, to acquire a first basic quantum circuit corresponding to the basic circuit structure; and
when the input and the output are determined to be the input and the output of the second basic quantum circuit to be constructed, a Toffoli gate acting on the qubits included in the basic circuit structure is constructed, or a NOT gate, a CNOT gate and a Toffoli gate acting on the qubits included in the basic circuit structure are constructed, to acquire a second basic quantum circuit corresponding to the basic circuit structure.

5. The method of claim 1, further comprising:
receiving the address represented by a quantum state;
parsing the address, and moving each bit of the address respectively to address bits of subtree node of a corresponding layer; wherein each one bit of the address corresponds to one respective layer of the N layers of the subtree node; and
starting from the leaf node, moving, according to an address stored in address bits of each layer of the subtree node, data stored in the leaf node to data bits of the Nth layer of the subtree node, until data corresponding to the address is output at a subtree node at the root of the binary tree structure.

6. The method of claim 5, wherein said moving each bit of the address respectively to address bits of subtree node of a corresponding layer comprises:
for each bit of the address, starting from k=N, moving the k-th bit of the address to the first layer of the subtree node at the root of the binary tree structure;
starting from the first layer of the subtree node, executing repeatedly moving of the k-th bit of the address in the current layer of the subtree node to the lower layer of subtree node, until it is moved to the address bits of the subtree node of the k-th layer, wherein the k is a positive integer taking values sequentially from N to 1.

7. A device for constructing a quantum circuit of a QRAM architecture, configured for accessing data and having a binary tree structure, the QRAM architecture comprising a root and N layers of subtree nodes and one layer of a leaf node, the subtree nodes comprising address bits and first data bits, the leaf node comprising second data bits for storing data, the N being an address length for writing into the QRAM architecture, comprising:
a circuit structure partitioning module, configured for partitioning the binary tree structure into one or more basic circuit structures, wherein each of the one or more a basic circuit structures comprise address bits and data bits of one subtree node and data bits of two child nodes in the lower layer of the one subtree node;

a qubit determining module, configured for determining qubits required for a basic quantum circuit to be constructed, according to qubits included in the basic circuit structure;

a bit relationship determining module, configured for determining an input and an output of the basic quantum circuit to be constructed, according to action relationships between the qubits required for the basic quantum circuit to be constructed; and a quantum circuit determining module, configured for constructing a basic quantum circuit corresponding to the one or more basic circuit structures, according to the input and the output using the required qubits and quantum logic gates, wherein the bit relationship determining module further comprises:

a first relationship determining unit, configured for: when the action relationship between qubits included in the basic circuit structure is a first action relationship, an input and an output of a first basic quantum circuit to be constructed are determined as follows: an output and an input of address bits of one subtree node remain unchanged, an input of data bits of the subtree node is one address bit and an output of the data bits of the subtree node is |0>, inputs of data bits of two child nodes of the lower layer are both |0>, outputs of data bits of the two child nodes of the lower layer are both the address bit; and a second relationship determining unit, configured for: when the action relationship between qubits included in the basic circuit structure is a second action relationship, an input and an output of a second basic quantum circuit to be constructed are determined as follows: an input of address bits of one subtree node is one address bit, an output of the address bits of the one subtree node remains unchanged, inputs of data bits of two child nodes of the lower layer are respectively a first data and a second data, outputs of the data bits of the two child nodes of the lower layer remain unchanged, an input of data bits of the subtree node is |0>, and an output of the data bits of the subtree node is determined by the address bit and is the first data or the second data.

8. A method for parsing quantum address data, applied to a pre-built quantum random storage access (QRAM) architecture for accessing data, the QRAM architecture comprising at least one layer of subtree nodes, wherein each layer of the subtree nodes includes corresponding address bits, comprising:

when receiving a target quantum address, sequentially acquiring each quantum address data in the target quantum address according to a preset data bit acquisition rule; and sequentially moving through a preset quantum circuit each quantum address data respectively to address bits of the subtree nodes of a corresponding layer in the QRAM architecture, so circuit is constructed through the method of claim 1 for constructing a quantum circuit of a QRAM architecture.

9. The method of claim 8, wherein the method further comprises, before said sequentially moving through a preset quantum circuit each quantum address data respectively to address bits of the subtree nodes of a corresponding layer in the QRAM architecture:

acquiring numbers of address bits of each quantum address data in the target quantum address, and determining corresponding layer of the subtree nodes for each quantum address data in the QRAM architecture according to preset corresponding rules and the numbers of address bits.

10. The method of claim 9, wherein a total number of bits of the target quantum address equals to a total number of layers of the subtree nodes in the QRAM architecture, both the total number of bits and the total number of layers are N, N being a positive integer, said sequentially moving through a preset quantum circuit each quantum address data respectively to address bits of the subtree nodes of a corresponding layer in the QRAM architecture specifically comprises:

acquiring a $0^{th}$ bit of address data in the target quantum address, determining the (N−1)-th layer of the subtree nodes in the QRAM architecture, and moving the $0^{th}$ bit of address data to address bits of the (N−1)-th layer of the subtree nodes through the preset quantum circuit; and acquiring the next bit of address data in the target quantum address, and determining the lower layer of the subtree nodes in the QRAM architecture, as to move the next bit of address data, until N address data in the target quantum address are respectively moved to address bits of corresponding N layers of the subtree nodes in the QRAM architecture.

11. The method of claim 10, wherein said moving the $0^{th}$ bit of address data to address bits of the (N−1)-th layer of the subtree nodes through the preset quantum circuit comprises:

moving the $0^{th}$ bit of the address data to data bits of the subtree nodes of the $0^{th}$ layer of the QRAM architecture;

moving, through the preset quantum circuit, the 0th bit of the address data in the data bits of the subtree nodes of the $0^{th}$ layer to the data bits of the subtree nodes of the lower layer, until the $0^{th}$ bit of address data is moved to the data bits of the subtree nodes of the (N−1)-th layer; and swapping the $0^{th}$ bit of the address data stored in the data bits of the subtree nodes of the (N−1)-th layer to address bits of the subtree nodes of the (N−1)-th layer.

12. The method of claim 11, wherein said acquiring the next bit of address data in the target quantum address, and determining the lower layer of the subtree nodes in the QRAM architecture, to move the next bit of address data comprises:

after the $0^{th}$ bit of the address data in the data bits of the subtree nodes of the 0th layer is moved to the data bits of the subtree nodes of the lower layer, moving through the preset quantum circuit the $1^{st}$ bit of the address data to the data bits of the subtree nodes of the $0^{th}$ layer of the QRAM architecture, as to execute moving of the address data in the target quantum address in a staggered way; and moving, through the preset quantum circuit, the $1^{st}$ bit of the address data in the data bits of the subtree nodes of the $0^{th}$ layer to data bits of the subtree nodes of the lower layer, until the $1^{st}$ bit of the address data is moved to data bits of the subtree nodes of the (N−2)-th layer.

13. The method of claim 10, wherein the QRAM architecture further comprises a leaf node connected to the subtree nodes of the (N−1)-th layer, the leaf node further comprises data bits of the leaf node for storing data, the method further comprises, after said sequentially moving through a preset quantum circuit each quantum address data respectively to address bits of the subtree nodes of a corresponding layer in the QRAM architecture, to complete the parsing of the target quantum address:

starting from the leaf node, moving, according to said each quantum address data stored in address bits of each layer of subtree node, target data stored in data bits of the leaf node to data bits of the upper layer of subtree node, until target data corresponding to the target quantum address is output at a subtree node at the root of the binary tree structure.

14. The method of claim 13, wherein the method further comprises, after said target data corresponding to the target quantum address is output at a subtree node at the root of the binary tree structure:

executing uncomputing on the QRAM structure to restore the QRAM structure to its initial state.

15. A storage medium having a computer program stored therein, wherein the computer program is configured to perform, during execution thereof, the method of claim 1.

16. An electronic device, comprising:
a memory having a computer program stored therein, and
a processor, configured to execute the computer program to perform the method of claim 1.

* * * * *